United States Patent
Lv et al.

(10) Patent No.: US 11,265,061 B2
(45) Date of Patent: Mar. 1, 2022

(54) CORRECTION APPARATUS AND CORRECTION METHOD

(71) Applicant: HUAWEI TECHNOLOGIES CO., LTD., Guangdong (CN)

(72) Inventors: Jinsong Lv, Shanghai (CN); Mo Chen, Shanghai (CN); Wei Wang, Shanghai (CN); Zhiwei Zhang, Shanghai (CN); Lie Zhang, Xi'an (CN)

(73) Assignee: Huawei Technologies Co., Ltd., Shenzhen (CN)

(*) Notice: Subject to any disclaimer, the term of this patent is extended or adjusted under 35 U.S.C. 154(b) by 35 days.

(21) Appl. No.: 16/727,364

(22) Filed: Dec. 26, 2019

(65) Prior Publication Data

US 2020/0136706 A1    Apr. 30, 2020

Related U.S. Application Data

(63) Continuation of application No. PCT/CN2017/090008, filed on Jun. 26, 2017.

(51) Int. Cl.
*H04L 12/50* (2006.01)
*H04B 7/06* (2006.01)
*H04L 27/36* (2006.01)

(52) U.S. Cl.
CPC ......... *H04B 7/0686* (2013.01); *H04B 7/0617* (2013.01); *H04L 27/364* (2013.01); *H04L 27/367* (2013.01)

(58) Field of Classification Search
CPC ........................................ H04L 12/50
(Continued)

(56) References Cited

U.S. PATENT DOCUMENTS 8,351,543 B2   1/2013   Kenington
9,306,506 B1   4/2016   Zhang et al.
(Continued)

FOREIGN PATENT DOCUMENTS

CN        1870614 A    11/2006
CN    101675584 A    3/2010
(Continued)

OTHER PUBLICATIONS

PCT International Search Report and Written Opinion in International Application No. PCT/CN2017/090,008, dated Mar. 15, 2018, 14 pages (With English Translation).
(Continued)

*Primary Examiner* — Dang T Ton
(74) *Attorney, Agent, or Firm* — Fish & Richardson P.C.

(57) ABSTRACT

The present disclosure relates to correction apparatus and correction methods. One example correction apparatus includes a first adjustment module, a plurality of second adjustment modules, a correction calculation module, and a plurality of non-ideal channels. One second adjustment module is disposed on one non-ideal channel. The first adjustment module is connected to each non-ideal channel. The correction calculation module is separately connected to the first adjustment module and the plurality of second adjustment modules. The correction calculation module is connected to an output end of each non-ideal channel. The non-ideal channel is a channel that outputs an output signal in response to a drive signal having an error value.

17 Claims, 10 Drawing Sheets

(58) Field of Classification Search
USPC .......................................................... 370/329
See application file for complete search history.

(56) References Cited

U.S. PATENT DOCUMENTS

| | | | |
|---|---|---|---|
| 2003/0104794 | A1 | 6/2003 | Yang et al. |
| 2004/0204109 | A1 | 10/2004 | Hoppenstein |
| 2010/0244950 | A1 | 9/2010 | Morris et al. |
| 2011/0235749 | A1 | 9/2011 | Kenington |
| 2013/0121440 | A1 | 5/2013 | Cai et al. |
| 2014/0118066 | A1 | 5/2014 | Lee et al. |
| 2014/0133470 | A1 | 5/2014 | Mcgowan et al. |
| 2015/0103952 | A1 | 4/2015 | Wang et al. |
| 2015/0234647 | A1* | 8/2015 | Lai .................. G06F 40/205 717/169 |

FOREIGN PATENT DOCUMENTS

| | | |
|---|---|---|
| CN | 102055411 A | 5/2011 |
| CN | 102143107 A | 8/2011 |
| CN | 103716119 A | 4/2014 |
| CN | 105634414 A | 6/2016 |
| CN | 105897188 A | 8/2016 |
| CN | 106664269 B | 11/2019 |

OTHER PUBLICATIONS

Tervo et al., "Digital predistortion of amplitude varying phased array utilising over-the-air combining", XP033159941, Jun. 4, 2017, 4 pages.
Han et al., "Digital predistortion for hybrid precoding architecture in millimeter-wave massive mimo systems", XP033259059, Mar. 5, 2017, 5 pages.
Lee et al., "Digital Predistortion for Power Amplifiers in Hybrid MIMO Systems with Antenna Subarrays", XP033167254, May 11, 2015, 5 pages.
Extended European Search Report issued in European Application No. 17915766.4 dated Apr. 28, 2020, 12 pages.
Office Action issued in Chinese Application No. 201780091574.6 dated Jul. 21, 2020, 11 pages (with English translation).
Office Action issued in Japanese Application No. 2020-520692 dated Apr. 6, 2021, 7 pages (with English translation).
Office Action issued in Japanese Application No. 2020-520692 dated Dec. 21, 2021, 7 pages (with English translation).

* cited by examiner

CORRECTION APPARATUS AND CORRECTION METHOD

CROSS-REFERENCE TO RELATED APPLICATIONS

This application is a continuation of International Patent Application No. PCT/CN2017/090008, filed on Jun. 26, 2017, the disclosure of which is hereby incorporated by reference in its entirety.

TECHNICAL HELD

This application relates to the field of communications technologies, and in particular, to a correction apparatus and a correction method.

BACKGROUND

In the prior art, there is often a circuit in which a plurality of non-ideal channels is driven by using a single signal channel. The non-ideal channel may be, for example, a circuit with features such as nonlinearity, IQ imbalance, channel flatness, a channel delay error, a channel group delay ripple. Some elements in the circuit are easily affected by factors such as an environment and work in an abnormal state. Therefore, a signal in the circuit may be interfered, and an interference signal is introduced.

To enable the circuit to output a normal signal, the signal in the circuit usually needs to be corrected. A typical correction method is to dispose a correction circuit between an input end of the single signal channel and each non-ideal channel. A correction calculation module in the correction circuit obtains, through calculation, a correction parameter to adjust the global circuit, and then sends the correction parameter to a correction unit on the single signal channel, so that the correction unit uses the correction parameter to adjust an obtained signal, to adjust output signals of all the non-ideal channels and alleviate interference from the interference signal.

However, in such a solution, differences between the non-ideal channels are not considered, and signal correction is directly performed on the single signal channel. Consequently, accuracy and efficiency of correction are not high.

SUMMARY

Embodiments of this application provide a correction apparatus and a correction method, to improve efficiency of adjusting an error value of circuit signal.

A first aspect of the embodiments of this application provides a correction apparatus. The correction apparatus includes a first adjustment module, a plurality of second adjustment modules, a correction calculation module, and a plurality of non-ideal channels. One second adjustment module is disposed on one non-ideal channel. The first adjustment module is connected to each non-ideal channel. The correction calculation module is separately connected to the first adjustment module and the plurality of second adjustment modules. The correction calculation module is connected to an output end of each non-ideal channel. The non-ideal channel is such a channel that an output signal output in response to a drive signal has an error value.

The correction calculation module is configured to obtain a first adjustment parameter and a second adjustment parameter through calculation based on the output signal of the non-ideal channel and a reference signal. The reference signal is obtained based on the drive signal. The first adjustment module is configured to adjust the drive signal based on the first adjustment parameter, to uniformly correct error values of output signals of the plurality of non-ideal channels. The second adjustment module on each non-ideal channel is configured to adjust a channel signal based on the second adjustment parameter, to correct a part that is of the error value and that is not corrected by the first adjustment module. The channel signal is a signal that is input to the non-ideal channel after the first adjustment module adjusts the drive signal.

In this way, according to the correction apparatus, the first adjustment module uniformly corrects the error values of the output signals of the plurality of non-ideal channels; and after the first adjustment module adjusts the signals, on each non-ideal channel, the second adjustment module performs complementary correction on an error value of an output signal of a non-ideal channel to which the second adjustment module belongs, to correct a part that is of the error value and that is not corrected by the first adjustment module. In this way, the error values of the output signals of the plurality of non-ideal channels are eliminated. The two adjustment modules cooperate with each other, to improve efficiency of adjusting an error value of circuit signal.

With reference to the first aspect of the embodiments of this application, in a first implementation of the first aspect of the embodiments of this application, the reference signal includes the drive signal and the input signal of the non-ideal channel, the correction calculation module includes a first calculation unit and a second calculation unit, the first calculation unit is connected to the first adjustment module, the second calculation unit is connected to the second adjustment module, and the second calculation unit is further connected to an input end of the non-ideal channel. The first calculation unit is configured to obtain the first adjustment parameter through calculation based on the output signal of the non-ideal channel and the drive signal. The second calculation unit is configured to obtain the second adjustment parameter through calculation based on an output signal and an input signal that belong to a same non-ideal channel. The two different calculation units are disposed on the correction calculation module, and are respectively configured to calculate the first adjustment parameter and the second adjustment parameter. The first calculation unit and the second calculation unit may be disposed separately or may be disposed on a same component, so that the correction apparatus has more layouts.

With reference to the first aspect of the embodiments of this application, in a second implementation of the first aspect of the embodiments of this application, the correction apparatus may be applied in a scenario of an HBF architecture. In this case, the first adjustment module is a digital predistortion module, the second adjustment module is a nonlinear adjustment module, the correction calculation module is a hybrid beamforming HBF predistortion calculation module, the first adjustment parameter is a digital predistortion parameter, the second adjustment parameter is an analog nonlinear correction parameter, the drive signal is a digital I/Q complex signal, the non-ideal channel is an analog channel, and the channel signal is a radio frequency signal.

The correction apparatus further includes a digital-to-analog converter and a plurality of power amplifiers. One power amplifier is disposed on one analog channel. The power amplifier is connected to an output end of the nonlinear adjustment module. An input end of the digital-to-analog converter is connected to the digital predistortion module. An output end of the digital-to-analog converter is separately connected to the plurality of nonlinear adjustment modules. A factor in generation of the error value of the output signal of the analog channel includes nonlinearity of the power amplifier. The output signal of the analog channel is an output signal of the power amplifier. The HBF predistortion calculation module is configured to obtain the digital predistortion parameter and the analog nonlinear correction parameter through calculation based on the reference signal and the output signal of the analog channel. The reference signal is obtained based on the digital I/Q complex signal. The reference signal may be the digital I/Q complex signal, or may be the digital I/Q complex signal and the input signal of the analog channel. The input signal of the analog channel comes from the digital I/Q complex signal.

The digital predistortion module is configured to perform predistortion adjustment on the digital I/Q complex signal based on the digital predistortion parameter, to uniformly compensate for nonlinearity of the plurality of power amplifiers. The nonlinear adjustment module is configured to perform nonlinear adjustment on the radio frequency signal based on the analog nonlinear correction parameter, to compensate for a part that is of the nonlinearity of the power amplifier and that is not compensated by the digital predistortion module.

In this way, according to the correction apparatus, the digital predistortion module adjusts the digital I/Q complex signal, and the nonlinear adjustment module on each analog channel adjusts the radio frequency signal, so that nonlinearity of the power amplifiers on the plurality of analog channels can be compensated, thereby implementing linearization of the power amplifiers and reducing or eliminating the error values of the output signals of the analog channels.

With reference to the second implementation of the first aspect of the embodiments of this application, in a third implementation of the first aspect of the embodiments of this application, the HBF predistortion calculation module is further configured to obtain the digital predistortion parameter through calculation based on an output signal of any analog channel and the digital I/Q complex signal. The digital predistortion module uniformly compensates for the nonlinearity of the power amplifiers on the plurality of analog channels based on the digital predistortion parameter, that is, compensates for a common part of the nonlinearity of the plurality of power amplifiers. Therefore, the HBF predistortion calculation module only needs to obtain the output signal of any analog channel, and the digital predistortion parameter obtained by the HBF predistortion calculation module through calculation based on the output signal of any analog channel and the digital I/Q complex signal can be used to compensate for the nonlinearity of the power amplifiers on the plurality of analog channels.

With reference to the second implementation of the first aspect of the embodiments of this application, in a fourth implementation of the first aspect of the embodiments of this application, the reference signal includes the digital I/Q complex signal and the input signal of the analog channel, the HBF predistortion calculation module includes a first calculation unit and a second calculation unit, the first calculation unit is connected to the digital predistortion module, the second calculation unit is connected to the nonlinear adjustment module, and the second calculation unit is further connected to an input end of each analog channel.

The first calculation unit is configured to obtain the digital predistortion parameter through calculation based on the output signal of the analog channel and the digital I/Q complex signal. The second calculation unit is configured to obtain the analog nonlinear correction parameter through calculation based on an output signal and an input signal that belong to a same analog channel.

The two different calculation units are disposed on the HBF predistortion calculation module, and are respectively configured to calculate the digital predistortion parameter and the analog nonlinear correction parameter. The first calculation unit and the second calculation unit may be disposed separately or may be disposed on a same component, so that the correction apparatus has more layouts.

With reference to the second implementation of the first aspect of the embodiments of this application, in a fifth implementation of the first aspect of the embodiments of this application, a switch module is further disposed between the HBF predistortion calculation module and output ends of the plurality of power amplifiers in the correction apparatus. The switch module is configured to select an output signal of one of the plurality of analog channels in a time-division manner, so that the HBF predistortion calculation module obtains the output signal of the analog channel. According to a switching solution using the switch module, the output signals of the plurality of power amplifiers are fed back in a time-division manner, and ideal correction performance can still be achieved when a quantity of hardware channels is reduced.

With reference to the second implementation of the first aspect of the embodiments of this application, in a sixth implementation of the first aspect of the embodiments of this application, on each analog channel, the correction apparatus further includes an analog gain adjustment module and/or an analog phase adjustment module, the analog gain adjustment module and/or the analog phase adjustment module are/is close to an input end of the power amplifier, the analog gain adjustment module is connected to the IMF predistortion calculation module, and the analog phase adjustment module is connected to the HBF predistortion calculation module.

The analog gain adjustment module is configured to perform gain adjustment on the radio frequency signal based on an analog gain adjustment parameter, so that gains of output signals of different analog channels tend to be consistent. The analog phase adjustment module is configured to perform phase adjustment on the radio frequency signal based on the analog phase adjustment parameter, so that phases of output signals of different analog channels tend to be consistent. The gain adjustment parameter and the analog phase adjustment parameter come from the HBF predistortion calculation module. In other words, the HBF predistortion calculation module is further configured to obtain the analog gain adjustment parameter and/or the analog phase adjustment parameter through calculation based on the output signal of the analog channel. In this way, the gains and the phases for the plurality of analog channels are corrected, and a beam direction and nulling performance can be ensured.

With reference to the second to the sixth implementations of the first aspect of the embodiments of this application, in a seventh implementation of the first aspect of the embodiments of this application, the correction apparatus further includes an amplitude phase correction module, a plurality of transmit channels, and a plurality of receive channels, the transmit channel and the receive channel each are connected to an antenna, the transmit channel is the analog channel, the receive channel is an analog channel used to receive an antenna signal, one end of the amplitude phase correction module is connected to a port of the antenna, the other end of the amplitude phase correction module is connected to a channel on which a signal is output to the plurality of transmit channels, and the other end of the amplitude phase correction module is further connected to a channel on which a signal is obtained from the plurality of receive channels. The amplitude phase correction module is configured to: perform amplitude phase calibration on the plurality of transmit channels, and perform amplitude phase calibration on the plurality of receive channels. In this way, after the amplitude phase correction module completes the amplitude phase calibration on the transmit channels and the receive channels, the foregoing HBF DPD calibration is performed, to obtain better performance.

With reference to the seventh implementation of the first aspect of the embodiments of this application, in an eighth implementation of the first aspect of the embodiments of this application, the transmit channel and the receive channel are packaged in a form of a chip, the chip includes the transmit channel and the receive channel, and the amplitude phase correction module is separately connected to the transmit channel and the receive channel by using a switching switch. The switching switch is configured to connect the amplitude phase correction module to the transmit channel and the receive channel in a time-division manner, so that the amplitude phase correction module performs amplitude phase calibration on the plurality of transmit channels and performs amplitude phase calibration on the plurality of receive channels in a time-division manner. In this way, a same component used when the amplitude phase calibration is performed on the transmit channels and the receive channels may be shared, thereby reducing components of the correction apparatus and reducing costs.

With reference to the seventh implementation of the first aspect of the embodiments of this application, in a ninth implementation of the first aspect of the embodiments of this application, a transmit channel and a receive channel are packaged in a form of a chip, there are a plurality of chips, and each chip includes a plurality of transmit channels or a plurality of receive channels. The amplitude phase correction module is configured to: first perform amplitude phase calibration on the plurality of transmit channels or the plurality of receive channels in the chip, and then perform amplitude phase calibration on the transmit channels or the receive channels in different chips. In this way, efficiency of amplitude phase calibration can be improved.

A second aspect of the embodiments of this application provides a correction method. The method is applied to a correction calculation module in a correction apparatus. The correction apparatus includes a first adjustment module, a plurality of second adjustment modules, the correction calculation module, and a plurality of non-ideal channels. One second adjustment module is disposed on one non-ideal channel. The first adjustment module is connected to each non-ideal channel. The correction calculation module is separately connected to the first adjustment module and the plurality of second adjustment modules. The correction calculation module is connected to an output end of each non-ideal channel. The non-ideal channel is such a channel that an output signal output in response to a drive signal has an error value.

The method in this implementation includes:
obtaining, by the correction calculation module, the output signal of the non-ideal channel and a reference signal, where the reference signal is obtained based on the drive signal; then, obtaining, by the correction calculation module, a first adjustment parameter and a second adjustment parameter through calculation based on the output signal of the non-ideal channel and the reference signal; outputting, by the correction calculation module, the first adjustment parameter to the first adjustment module, so that the first adjustment module adjusts the drive signal based on the first adjustment parameter, to uniformly correct error values of output signals of the plurality of non-ideal channels; and outputting, by the correction calculation module, the second adjustment parameter to the second adjustment module on each non-ideal channel, so that the second adjustment module on each non-ideal channel adjusts a channel signal based on the second adjustment parameter, to correct a part that is of the error value and that is not corrected by the first adjustment module, where the channel signal is a signal that is input to the non-ideal channel after the first adjustment module adjusts the drive signal.

In this way, according to the correction method in this implementation, the first adjustment module uniformly corrects the error values of the output signals of the plurality of non-ideal channels; and after the first adjustment module adjusts the signals, on each non-ideal channel, the second adjustment module performs complementary correction on an error value of an output signal of a non-ideal channel to which the second adjustment module belongs, to correct a part that is of the error value and that is not corrected by the first adjustment module. In this way, the error values of the output signals of the plurality of non-ideal channels are eliminated. The two adjustment modules cooperate with each other, to improve efficiency of adjusting an error value of circuit signal.

With reference to the second aspect of the embodiments of this application, in a first implementation of the second aspect of the embodiments of this application, the reference signal includes the drive signal and the input signal of the non-ideal channel, the correction calculation module includes a first calculation unit and a second calculation unit, the first calculation unit is connected to the first adjustment module, the second calculation unit is connected to the second adjustment module, and the second calculation unit is further connected to an input end of the non-ideal channel. The obtaining, by the correction calculation module, a first adjustment parameter and a second adjustment parameter through calculation based on the output signal of the non-ideal channel and the reference signal includes: obtaining, by the first calculation unit, the first adjustment parameter through calculation based on the output signal of the non-ideal channel and the drive signal; and obtaining, by the second calculation unit, the second adjustment parameter through calculation based on an output signal and an input signal that belong to a same non-ideal channel. The two different calculation units are disposed on the correction calculation module, and are respectively configured to calculate the first adjustment parameter and the second adjustment parameter. The first calculation unit and the second calculation unit may be disposed separately or may be disposed on a same component, so that the correction apparatus has more layouts.

With reference to the second aspect of the embodiments of this application, in a second implementation of the second aspect of the embodiments of this application, the correction method in this embodiment of this application may be applied in a scenario of an HBF architecture. In this case, the first adjustment module is a digital predistortion module, the second adjustment module is a nonlinear adjustment module, the correction calculation module is a hybrid beamforming HBF predistortion calculation module, the first adjustment parameter is a digital predistortion parameter, the second adjustment parameter is an analog nonlinear correction parameter, the drive signal is a digital I/Q complex signal, the non-ideal channel is an analog channel, and the channel signal is a radio frequency signal.

The correction apparatus further includes a digital-to-analog converter and a plurality of power amplifiers. One power amplifier is disposed on one analog channel. The power amplifier is connected to an output end of the nonlinear adjustment module. An input end of the digital-to-analog converter is connected to the digital predistortion module. An output end of the digital-to-analog converter is separately connected to the plurality of nonlinear adjustment modules. A factor in generation of the error value of the output signal of the analog channel includes nonlinearity of the power amplifier. The output signal of the analog channel is an output signal of the power amplifier.

The outputting, by the correction calculation module, the first adjustment parameter to the first adjustment module includes: outputting, by the HBF predistortion calculation module, the digital predistortion parameter to the digital predistortion module, so that the digital predistortion module performs predistortion adjustment on the digital I/Q complex signal based on the digital predistortion parameter, to uniformly compensate for nonlinearity of the plurality of power amplifiers.

The outputting, by the correction calculation module, the second adjustment parameter to the second adjustment module on each non-ideal channel includes: outputting, by the HBF predistortion calculation module, the analog nonlinear correction parameter to the nonlinear adjustment module on each analog channel, so that the nonlinear adjustment module performs nonlinear adjustment on the radio frequency signal based on the analog nonlinear correction parameter, to compensate for a part that is of the nonlinearity of the power amplifier and that is not compensated by the digital predistortion module.

In this way, according to the correction method, the HBF predistortion calculation module obtains the digital predistortion parameter through calculation, to output the digital predistortion parameter to the digital predistortion module. According to the correction method, the HBF predistortion calculation module obtains the analog nonlinear correction parameter through calculation, to output the analog nonlinear correction parameter to the nonlinear adjustment module. The digital predistortion module adjusts the digital I/Q complex signal, and the nonlinear adjustment module on each analog channel adjusts the radio frequency signal, so that nonlinearity of the power amplifiers on the plurality of analog channels can be compensated, thereby implementing linearization of the power amplifiers and reducing or eliminating the error values of the output signals of the analog channels.

With reference to the second implementation of the second aspect of the embodiments of this application, in a third implementation of the second aspect of the embodiments of this application, the obtaining, by the correction calculation module, an output signal of the non-ideal channel includes: obtaining, by the HBF predistortion calculation module, an output signal of any analog channel.

The obtaining, by the correction calculation module, a first adjustment parameter through calculation based on the output signal of the non-ideal channel and the reference signal includes: obtaining, by the HBF predistortion calculation module, the digital predistortion parameter through calculation based on the output signal of any analog channel and the digital I/Q complex signal. The HBF predistortion calculation module only needs to obtain the output signal of any analog channel. The digital predistortion parameter obtained by the HBF predistortion calculation module through calculation based on the output signal of any analog channel and the digital I/Q complex signal can be used to compensate for the nonlinearity of the power amplifiers on the plurality of analog channels.

With reference to the second implementation of the second aspect of the embodiments of this application, in a fourth implementation of the second aspect of the embodiments of this application, the reference signal includes the digital I/Q complex signal and the input signal of the analog channel, the HBF predistortion calculation module includes a first calculation unit and a second calculation unit, the first calculation unit is connected to the digital predistortion module, the second calculation unit is connected to the nonlinear adjustment module, and the second calculation unit is further connected to an input end of each analog channel.

The obtaining, by the correction calculation module, the output signal of the non-ideal channel and a reference signal includes: obtaining, by the first calculation unit, the output signal of the analog channel and the digital I/Q complex signal; and obtaining, by the second calculation unit, the output signal of the analog channel and the input signal of the analog channel.

The obtaining, by the correction calculation module, a first adjustment parameter and a second adjustment parameter through calculation based on the output signal of the non-ideal channel and the reference signal includes: obtaining, by the first calculation unit, the digital predistortion parameter through calculation based on the output signal of the analog channel and the digital I/Q complex signal; and obtaining, by the second calculation unit, the analog nonlinear correction parameter through calculation based on an output signal and an input signal that belong to a same analog channel.

The two different calculation units are disposed on the HBF predistortion calculation module, and are respectively configured to calculate the digital predistortion parameter and the analog nonlinear correction parameter. The first calculation unit and the second calculation unit may be disposed separately or may be disposed on a same component, so that the correction apparatus has more layouts.

With reference to the fourth implementation of the second aspect of the embodiments of this application, in a fifth implementation of the second aspect of the embodiments of this application, the obtaining, by the second calculation unit, the analog nonlinear correction parameter through calculation based on an output signal and an input signal that belong to a same analog channel includes: obtaining, by the second calculation unit, a difference value through calculation based on the output signal and the input signal that belong to the same non-ideal channel, where the difference value is a difference between an output signal of the power amplifier on the analog channel and a preset output signal; and obtaining, by the second calculation unit, the analog nonlinear correction parameter through calculation by applying a cascaded predistortion PD model to the difference value. In this way, the second calculation unit can calculate the analog nonlinear correction parameter.

With reference to any one of the second to the fourth implementations of the second aspect of the embodiments of this application, in a sixth implementation of the second aspect of the embodiments of this application, on each analog channel, the correction apparatus further includes an analog gain adjustment module and/or an analog phase adjustment module, the analog gain adjustment module and/or the analog phase adjustment module are/is close to an input end of the power amplifier, the analog gain adjustment module is connected to the HBF predistortion calculation module, and the analog phase adjustment module is connected to the HBF predistortion calculation module.

The method in this implementation further includes:

obtaining, by the HBF predistortion calculation module, the analog gain adjustment parameter and/or the analog phase adjustment parameter through calculation based on the output signal of the analog channel; then, outputting, by the HBF predistortion calculation module, the analog gain adjustment parameter to the analog gain adjustment module, so that the analog gain adjustment module performs gain adjustment on the radio frequency signal based on the analog gain adjustment parameter; and outputting, by the HBF predistortion calculation module, the analog phase adjustment parameter to the analog phase adjustment module, so that the analog phase adjustment module performs phase adjustment on the radio frequency signal based on the analog phase adjustment parameter.

After obtaining the analog gain adjustment parameter and the analog phase adjustment parameter through calculation, the HBF predistortion calculation module respectively outputs the analog gain adjustment parameter and the analog phase adjustment parameter to the analog gain adjustment module and the analog phase adjustment module. In this way, the gains and the phases for the plurality of analog channels are corrected, and a beam direction and nulling performance can be ensured.

Another aspect of this application provides a computer-readable storage medium. The computer-readable storage medium stores an instruction. When the instruction is run on a computer, the computer is enabled to perform the methods in the foregoing aspects.

Another aspect of this application provides a computer program product including an instruction. When the computer program product is run on a computer, the computer is enabled to perform the methods in the foregoing aspects.

In the technical solutions provided in the embodiments of this application, the correction apparatus includes the first adjustment module, the plurality of second adjustment modules, the correction calculation module, and the plurality of non-ideal channels. One second adjustment module is disposed on one non-ideal channel. The first adjustment module is connected to each non-ideal channel. The correction calculation module is separately connected to the first adjustment module and the plurality of second adjustment modules. The correction calculation module is connected to the output end of each non-ideal channel. The non-ideal channel is such a channel that the output signal output in response to the drive signal has an error value. The correction calculation module is configured to obtain the first adjustment parameter and the second adjustment parameter through calculation based on the output signal of the non-ideal channel and the reference signal. The reference signal is obtained based on the drive signal. The first adjustment module is configured to adjust the drive signal based on the first adjustment parameter, to uniformly correct the error values of the output signals of the plurality of non-ideal channels. The second adjustment module on each non-ideal channel is configured to adjust the channel signal based on the second adjustment parameter, to correct the part that is of the error value and that is not corrected by the first adjustment module, where the channel signal is a signal that is input to the non-ideal channel after the first adjustment module adjusts the drive signal.

In this way, before the signals of the plurality of non-ideal channels are output, the first adjustment module adjusts the drive signal based on the first adjustment parameter, to uniformly correct the error values of the output signals of the plurality of non-ideal channels in advance, so that the first adjustment module performs error adjustment for the first time on the output signals of the plurality of non-ideal channels connected to the first adjustment module. However, the non-ideal channels may be different, and the error values of the output signals of the different non-ideal channels may be different. The first adjustment module can only uniformly adjust the error values for the plurality of non-ideal channels, that is, perform the same correction on the error values for the plurality of non-ideal channels. Consequently, differences between the error values for the plurality of non-ideal channels cannot be corrected by the first adjustment module. Therefore, after obtaining the channel signal that is input to the non-ideal channel after the first adjustment module adjusts the drive signal, the second adjustment module on each non-ideal channel adjusts the channel signal based on the second adjustment parameter, to correct in advance the part that is of the error value and that is not corrected by the first adjustment module. In this way, complementary correction is performed on the error value of the output signal of each non-ideal channel, to eliminate the differences between the error values for the plurality of non-ideal channels. The first adjustment parameter and the second adjustment parameter are obtained by the correction calculation module through calculation based on the output signal of the non-ideal channel and the reference signal obtained based on the drive signal. The first adjustment module and the second adjustment module respectively obtain the first adjustment parameter and the second adjustment parameter from the correction calculation module. In this way, according to the correction apparatus and the correction method in the embodiments of this implementation, the first adjustment module uniformly corrects the error values of the output signals of the plurality of non-ideal channels. In addition, after the first adjustment module adjusts the signals, on each non-ideal channel, the second adjustment module performs complementary correction on the error value of the output signal of a non-ideal channel to which the second adjustment module belongs, to correct the part that is of the error value and that is not corrected by the first adjustment module. In this way, the error values of the output signals of the plurality of non-ideal channels are eliminated. The two adjustment modules cooperate with each other, to improve efficiency of adjusting an error value of circuit signal.

DESCRIPTION OF EMBODIMENTS

Figure 1:
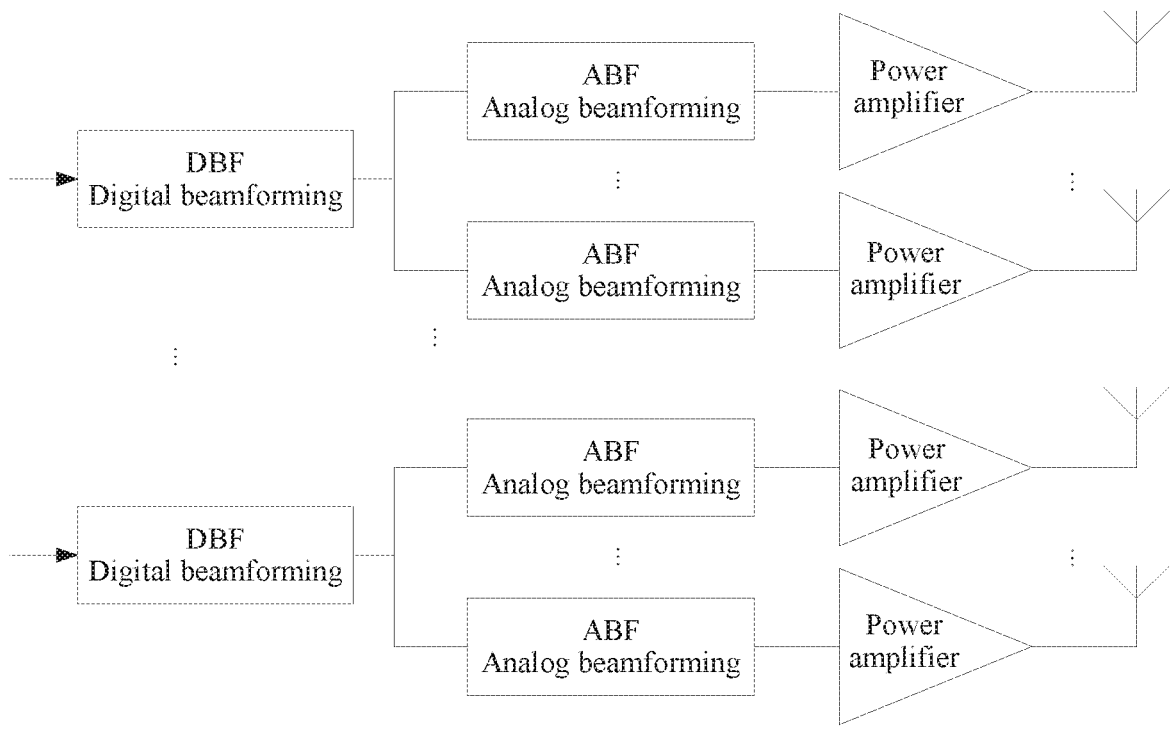
FIG. 1 is a schematic structural diagram of an HBF architecture according to an embodiment of this application.

The embodiments of this application provide a correction apparatus and a correction method, to improve efficiency of adjusting an error value of circuit signal.

In this specification, the claims, and the accompanying drawings of this application, the terms "first", "second", "third", "fourth", and the like (if any) are intended to distinguish between similar objects but do not necessarily indicate a specific order or sequence. It should be understood that the data termed in such a way is interchangeable in proper cases, so that the embodiments described herein can be implemented in an order other than the order illustrated or described herein. In addition, the terms "include", "contain", and any other variants are intended to cover a non-exclusive inclusion. For example, a process, method, system, product, or device that includes a list of steps or units is not necessarily limited to those steps or units expressly listed, but may include other steps or units not expressly listed or inherent to the process, method, product, or device.

The correction apparatus and the correction method provided in the embodiments of this application may be applied to a plurality of architectures. A feature of these architectures is that a plurality of non-ideal channels are driven by a single signal channel. To be specific, the architectures each include one channel for transmitting a drive signal, and the channel is connected to the plurality of non-ideal channels. The non-ideal channel is such a channel that an output signal obtained in response to a drive signal has an error value. A response from an actual hardware circuit of the non-ideal channel within an operating frequency band is not an expected fixed value but is affected by a noise factor. After the non-ideal channel obtains the drive signal, the output signal of the non-ideal channel has the error value. The noise factor includes but is not limited to one or more factors such as a frequency (a frequency response), a time (a time change and a memory effect), a temperature (a temperature change), and a size of an input signal (nonlinear). The non-ideal channel includes but is not limited to channels of nonlinearity, IQ (quadrature complex signal) imbalance, channel flatness, a channel delay error, a channel group delay ripple, and the like.

All architectures having the foregoing features may use the correction apparatus and the correction method provided in the embodiments of this application. To be specific, the architecture is decomposed into a channel for transmitting a drive signal and a plurality of analog channels, and adjustment is separately performed on the channel for transmitting a drive signal and the plurality of non-ideal channels, so that error values of output signals of the non-ideal channels are corrected. Such a model decomposition manner can reduce resource consumption and improve correction performance. In addition, correction parts of the non-ideal channels can reduce differences between the non-ideal channels, to further improve correction performance.

The embodiments of this application focus on correction for a non-ideal channel. Some specific scenarios for the non-ideal channel are described as follows:

(1) Nonlinearity: The nonlinearity is introduced due to an inherent feature of a semiconductor. For example, a volt-ampere response curve of a diode or a triode is not a straight line, but reflects that an output signal/input signal does not keep constant after entering a nonlinear operating interval.

(2) IQ imbalance: The IQ imbalance is caused because amplitudes of an I signal and a Q signal or phases of an I signal and a Q signal do not match each other.

(3) Channel flatness: A cause for the channel flatness is inability to ensure that an impedance is ideally 50 ohms in a wideband range. Echo superposition of cascaded parts causes a ripple of a frequency response. In addition, due to an inherent operating bandwidth (a semiconductor technique) of an active amplifier and the like, a gain decreases as a frequency increases.

(4) Delay error: The delay error is mainly introduced due to a component, a cable layout, and the like. Different channels pass through different components, filters, and microstrip layouts. A signal cable layout length difference directly corresponds to a delay difference. The group delay ripple is used to indicate a phase distortion degree of a channel. A main factor is a filter in a channel, and other factors include echo superposition deterioration caused due to matching of stages of components and layouts.

To intuitively describe the correction apparatus and the correction method provided in the embodiments of this application, the following provides a detailed description by using scenarios of a non-ideal channel having nonlinearity. The non-ideal channel having the nonlinearity may be, for example, an analog channel. For ease of understanding of the following description, one of the scenarios of the non-ideal channel having nonlinearity, namely, an HBF (Hybrid Beamforming) architecture, is first described herein.

For a structure of the HBF architecture, refer to FIG. 1. The HBF architecture includes a digital channel and a plurality of analog channels connected to the digital channel. An output end of the analog channel is connected to an antenna. The analog channel includes a power amplifier. Because the power amplifier has nonlinearity, the analog channel has nonlinearity. In other words, after the analog channel obtains a drive signal, an output response of the analog channel has nonlinearity.

The nonlinearity of the power amplifier indicates that: nonlinear distortion is gradually generated as an input power of the power amplifier increases, and further a new frequency component is generated, affecting signal quality and interfering with another device.

Linearization of the power amplifier means alleviating impact of nonlinearity on radio frequency performance by using various means, and maintaining relatively high amplifier efficiency as much as possible.

A signal obtained by the analog channel in the embodiments of this application is a radio frequency signal. Therefore, the power amplifier disposed on the analog channel may be a radio frequency power amplifier.

Conventional channel linearization technologies are all applied to a single channel. Main methods include a power back-off technology, an analog predistortion technology, and a DPD (Digital Pre-Distortion) technology. The digital predistortion technology can not only greatly improve device efficiency, but also can ensure relatively good signal quality. Therefore, the digital predistortion technology is most widely applied.

As a wireless technology evolves, a linearization technology for a multi-channel architecture is required due to application of a MIMO (Multi-Input Multi-Output) technology. MIMO in the 3rd/4th mobile communications systems widely uses a DBF (Digital Beamforming) architecture. Therefore, linearization of a multi-channel architecture can be implemented through simple extension of a single-channel architecture.

With further evolution of 5G (5th generation mobile networks, 5th generation mobile communications system) and application of a millimeter wave and a large-scale antenna array, if the DBF architecture is still used, a quantity of transmit channels of a transmitter increases sharply, and device costs/power consumption is hardly bearable. To reduce implementation costs of the transmitter, the quantity of transmit channels needs to be reduced, and the HBF architecture becomes a research focus of 5G. To improve output linearity and efficiency of the power amplifier in the hybrid beamforming architecture, it is necessary to research on a method for correcting distortion of a plurality of power amplifiers in this architecture. It is of great application and research value to technical evolution of the transmitter in the 5G system.

Figure 2:
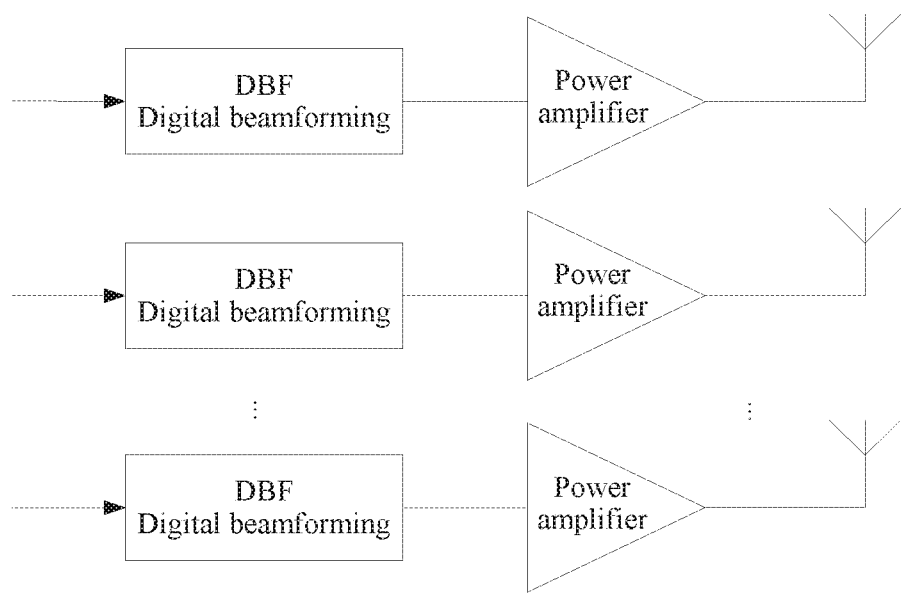
FIG. 2 is a schematic structural diagram of a DBF architecture according to another embodiment of this application.

For a schematic diagram of the DBF architecture, refer to FIG. 2. For the schematic diagram of the HBF architecture, refer to FIG. 1.

Figure 3:
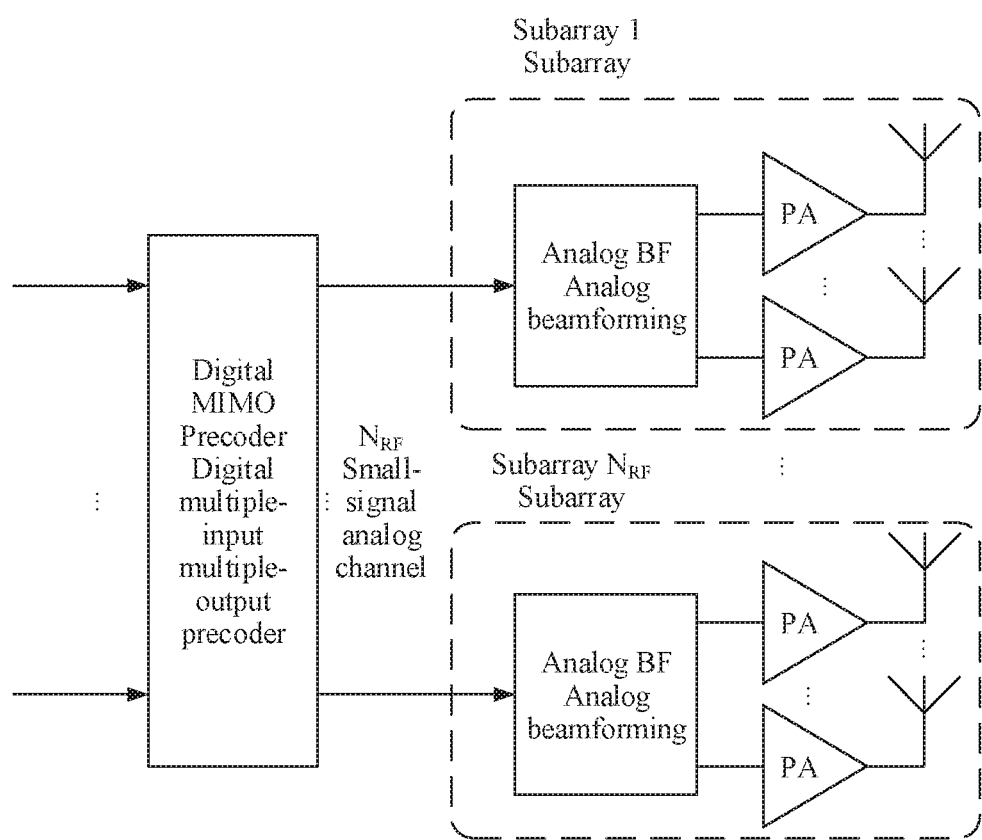
FIG. 3 is a schematic structural diagram of an HBF architecture according to another embodiment of this application.

For detailed illustration of the HBF architecture, refer to FIG. 3. As shown in FIG. 3, beamforming and MIMO in a device of the HBF architecture are implemented through two-level weighting. A first level is digital weighting, and a second level may be analog weighting or digital weighting. $N_{RF}$ quantity≤PA quantity antenna quantity, where $N_{RF}$ is a small-signal analog channel.

The device of the HBF architecture includes the following network elements:

a wireless communications device, which completes analog signal filtering, analog signal amplification, mutual conversion between an analog signal and a digital signal, digital processing of a receive signal and a transmit signal, and the like;

a PA (Power Amplifier), configured to amplify and output a high-power radio frequency signal; and a digital signal transmitter configured to generate a multi-channel digital baseband I/Q signal.

With reference to the foregoing content, the following describes the correction apparatus and the correction method in the embodiments of this application in detail.

Figure 4:
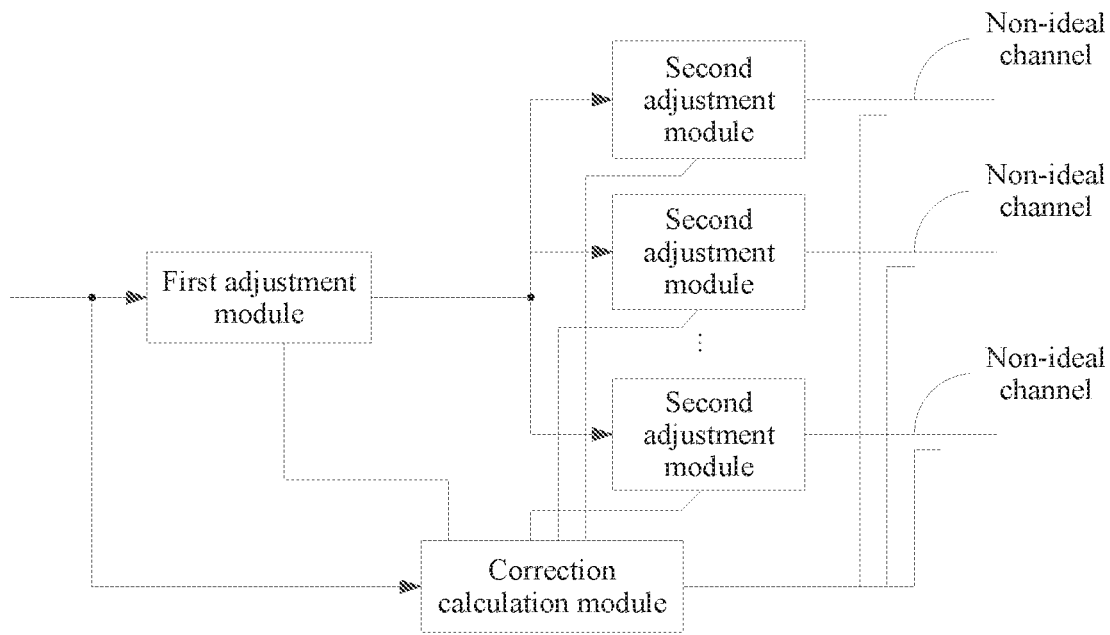
FIG. 4 is a schematic structural diagram of a correction apparatus according to another embodiment of this application.

FIG. 4 is a schematic structural diagram of a correction apparatus according to an embodiment of this application. As shown in FIG. 4, the correction apparatus includes a first adjustment module, a plurality of second adjustment modules, a correction calculation module, and a plurality of non-ideal channels. One second adjustment module is disposed on one non-ideal channel. The first adjustment module is connected to each non-ideal channel. The correction calculation module is separately connected to the first adjustment module and the plurality of second adjustment modules. The correction calculation module is connected to an output end of each non-ideal channel. The non-ideal channel is such a channel that an output signal output in response to a drive signal has an error value. There are a plurality of factors that cause the error value of the output signal of the non-ideal channel, for example, an ambient temperature and a circuit cable layout length. For details, refer to the foregoing descriptions of some specific scenarios of the non-ideal channel.

The correction calculation module is configured to obtain a first adjustment parameter and a second adjustment parameter through calculation based on the output signal of the non-ideal channel and a reference signal. The reference signal is obtained based on the drive signal. The reference signal may be the drive signal or a signal from the drive signal. The first adjustment module is configured to adjust the drive signal based on the first adjustment parameter, to uniformly correct error values of output signals of the plurality of non-ideal channels. The second adjustment module on each non-ideal channel is configured to adjust a channel signal based on the second adjustment parameter, to correct a part that is of the error value and that is not corrected by the first adjustment module. The channel signal is a signal that is input to the non-ideal channel after the first adjustment module adjusts the drive signal. In the correction apparatus, signals first pass through the first adjustment module, and are adjusted by the first adjustment module; and then, separately enter different non-ideal channels, and are adjusted by the second adjustment modules on the non-ideal channels, so that the output signals are output from the non-ideal channels in response to the signals adjusted by the first adjustment module and the second adjustment module.

A channel on which the first adjustment module is located may be referred to as a drive channel. The drive channel is connected to the plurality of non-ideal channels, and provides channel signals for the plurality of non-ideal channels.

Figure 5:
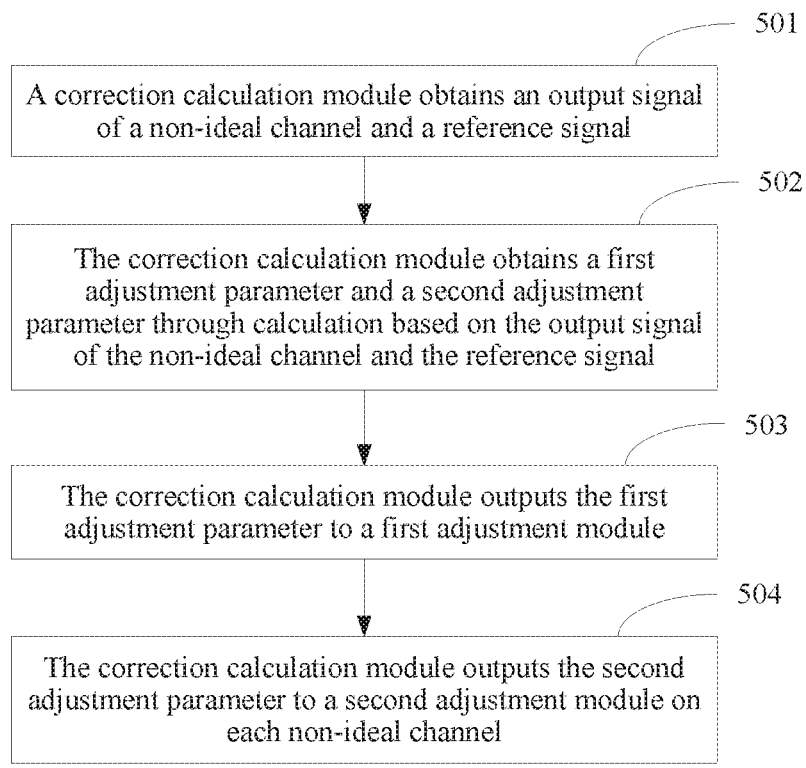
FIG. 5 is a method flowchart of a correction method that is applied to the correction calculation module in the embodiment shown in FIG. 4 according to another embodiment of this application.

The correction calculation module in the correction apparatus further performs a correction method. As shown in FIG. 5, the method includes the following steps.

Step 501: The correction calculation module obtains the output signal of the non-ideal channel and the reference signal.

The reference signal is obtained based on the drive signal. The reference signal may be, for example, a drive signal obtained by a digital predistortion module, or the reference signal includes the drive signal and the input signal of the non-ideal channel. The input signal of the non-ideal channel comes from the drive signal adjusted by the first adjustment module.

Step 502: The correction calculation module obtains the first adjustment parameter and the second adjustment parameter through calculation based on the output signal of the non-ideal channel and the reference signal.

The output signal of the non-ideal channel is an actual output signal of the non-ideal channel. The reference signal belongs to a signal that has not yet been input to the non-ideal channel. On the non-ideal channel, the output signal is obtained based on the reference signal, so that a preset output signal of the non-ideal channel can be obtained based on the reference signal. The preset output signal is an output signal that does not have an error value on the non-ideal channel. Therefore, correction parameters: the first adjustment parameter and the second adjustment parameter are obtained based on the preset output signal and the actual output signal of the non-ideal channel.

In some embodiments of this application, the reference signal includes the drive signal. The correction calculation may obtain the first adjustment parameter and the second adjustment parameter through calculation based on the output signal of the non-ideal channel and the drive signal obtained by the first adjustment module.

In some embodiments of this application, the reference signal includes the drive signal and the input signal of the non-ideal channel. The correction calculation may obtain the first adjustment parameter through calculation based on the output signal of the non-ideal channel and the drive signal obtained by the first adjustment module, and the correction calculation module may obtain the second adjustment parameter through calculation based on an output signal and an input signal that belong to a same non-ideal channel.

It may be understood that, different non-ideal channels may have different second adjustment parameters. The first adjustment module is connected to the plurality of non-ideal channels, the first adjustment module adjusts a same error value of the plurality of non-ideal channels by adjusting the drive signal, and after the adjustment performed by the first adjustment module, the second adjustment module further adjusts an error value of a non-ideal channel to which the second adjustment module belongs. Therefore, the correction calculation module may output different second adjustment parameters to different non-ideal channels. To be specific, the correction calculation needs to obtain different second adjustment parameters through calculation based on parameters (for example, output signals or input signals) of different non-ideal channels and output the second adjustment parameters to corresponding non-ideal channels.

Step 503: The correction calculation module outputs the first adjustment parameter to the first adjustment module.

The correction calculation module outputs the first adjustment parameter to the first adjustment module, so that the first adjustment module adjusts the drive signal based on the first adjustment parameter, to uniformly correct the error values of the output signals of the plurality of non-ideal channels.

Step 504: The correction calculation module outputs the second adjustment parameter to the second adjustment module on each non-ideal channel.

The correction calculation module outputs the second adjustment parameter to the second adjustment module on each non-ideal channel, so that the second adjustment module on each non-ideal channel adjusts the channel signal based on the second adjustment parameter, to correct a part that is of the error value and that is not corrected by the first adjustment module. The channel signal is a signal that is input to the non-ideal channel after the first adjustment module adjusts the drive signal.

In this way, before the signals of the plurality of non-ideal channels are output, the first adjustment module adjusts the drive signal based on the first adjustment parameter, to uniformly correct the error values of the output signals of the plurality of non-ideal channels in advance, so that the first adjustment module performs error adjustment for the first time on the output signals of the plurality of non-ideal channels connected to the first adjustment module. However, the non-ideal channels may be different, and the error values of the output signals of the different non-ideal channels may be different. The first adjustment module can only uniformly adjust the error values for the plurality of non-ideal channels, that is, perform the same correction on the error values for the plurality of non-ideal channels. Consequently, differences between the error values for the plurality of non-ideal channels cannot be corrected by the first adjustment module. Therefore, after obtaining the channel signal that is input to the non-ideal channel after the first adjustment module adjusts the drive signal, the second adjustment module on each non-ideal channel adjusts the channel signal based on the second adjustment parameter, to correct in advance the part that is of the error value and that is not corrected by the first adjustment module. In this way, complementary correction is performed on the error value of the output signal of each non-ideal channel, to eliminate the differences between the error values for the plurality of non-ideal channels. The first adjustment parameter and the second adjustment parameter are obtained by the correction calculation module through calculation based on the output signal of the non-ideal channel and the reference signal obtained based on the drive signal. The first adjustment module and the second adjustment module respectively obtain the first adjustment parameter and the second adjustment parameter from the correction calculation module. In this way, according to the correction apparatus and the correction method in the embodiments of this implementation, the first adjustment module uniformly corrects the error values of the output signals of the plurality of non-ideal channels. In addition, after the first adjustment module adjusts the signals, on each non-ideal channel, the second adjustment module performs complementary correction on the error value of the output signal of a non-ideal channel to which the second adjustment module belongs, to correct the part that is of the error value and that is not corrected by the first adjustment module. In this way, the error values of the output signals of the plurality of non-ideal channels are eliminated. The two adjustment modules cooperate with each other, to improve efficiency of adjusting an error value of circuit signal.

Signal adjustment performed by the first adjustment module and the second adjustment module belongs to pre-adjustment. In other words, before the signal of the non-ideal channel is output, the signal of the correction apparatus is adjusted, so that a signal with a reduced error value is output on the non-ideal channel based on the adjusted signal. For example, if an output response of a non-ideal channel is not made based on the signal pre-adjusted by the first adjustment module and the second adjustment module, an error value of the output signal of the non-ideal channel is an increase of a preset value X when being affected by a noise factor. However, after the correction apparatus provided in this embodiment of this application is used, the signal in the correction apparatus is pre-adjusted by the first adjustment module and the second adjustment module. In this case, if the non-ideal channel is not affected by the noise factor, the error value of the output signal of the non-ideal channel based on the pre-adjusted signal is a decrease of a preset value X. Therefore, pre-adjustment operations of the first adjustment module and the second adjustment module may alleviate impact of the noise factor on an output result. The error value of the output signal of the non-ideal channel based on the signal pre-adjusted by the first adjustment module and the second adjustment module is neutralized in the effect of the noise factor, to reduce or eliminate the error value.

To pre-adjust the signal, the first adjustment module needs to obtain the first adjustment parameter, to adjust the obtained drive signal based on the first adjustment parameter. The first adjustment module needs to obtain the first adjustment parameter from the correction calculation module. The correction calculation module obtains the first adjustment parameter through calculation based on the output signal of the non-ideal channel and the reference signal. The reference signal is obtained based on the drive signal. In this case, the reference signal may be the drive signal obtained by the first adjustment module.

The second adjustment module needs to obtain the second adjustment parameter, to adjust the channel signal based on the second adjustment parameter. The second adjustment module needs to obtain the second adjustment parameter from the correction calculation module. The correction calculation module may obtain the second adjustment parameter through calculation based on the output signal of the non-ideal channel and the reference signal. In this case, in some embodiments, the reference signal is the drive signal obtained by the first adjustment module. In some embodiments, the reference signal is the input signal of the non-ideal channel, and the input signal of the non-ideal channel comes from the drive signal adjusted by the first adjustment module.

To be specific, the correction calculation module analyzes the output signal of the non-ideal channel and the reference signal, determines whether the output signal of the non-ideal channel has the error value and how to adjust the error value, indicates, by using the first and the second adjustment parameters, information about adjusting the error value, outputs the first adjustment parameter to the first adjustment module, and outputs the second adjustment parameter to the second adjustment module. The two adjustment modules may adjust the signal, and accurately correct the error value of the output signal of the non-ideal channel.

The correction calculation module is specifically implemented in a plurality of manners, for example, in an integrated manner or in a separated manner. In the integrated manner, the correction calculation module may obtain the first adjustment parameter and the second adjustment parameter through calculation on a same module. For example, the correction calculation module is a chip. In the separated manner, the correction calculation module may include two calculation units. One calculation unit is configured to calculate the first adjustment parameter, and the other calculation unit is configured to calculate the second adjustment parameter.

Figure 6:
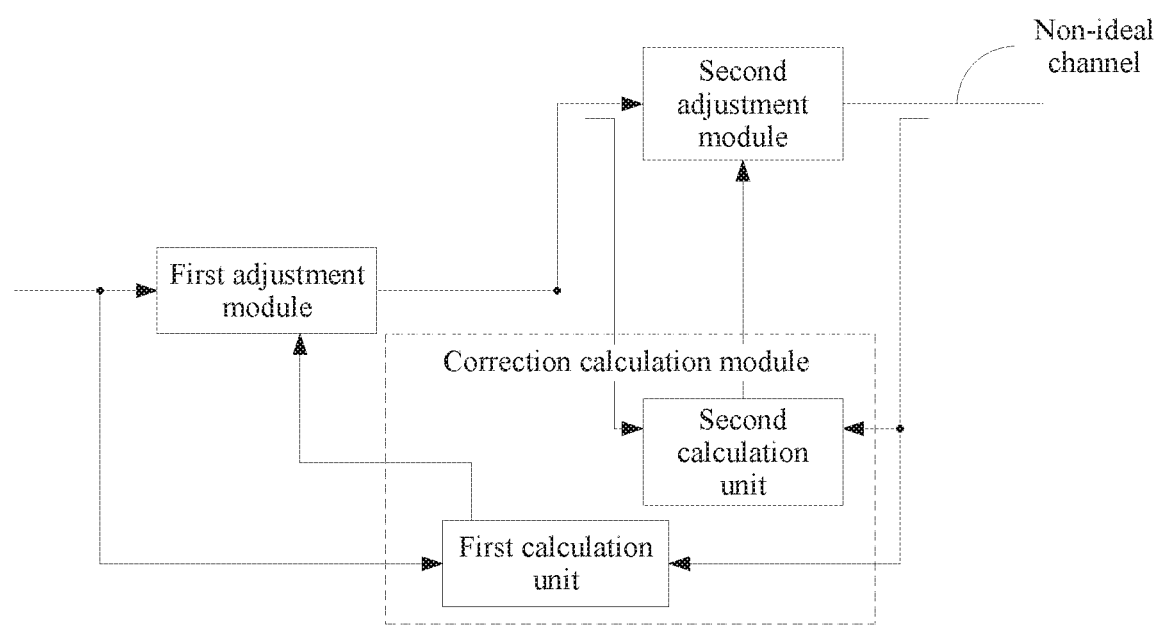
FIG. 6 is a schematic structural diagram of a correction apparatus according to another embodiment of this application.

For a solution of the correction calculation module implemented in the separated manner, refer to FIG. 6. Details are described as follows:

In this case, the reference signal includes the drive signal and the input signal of the non-ideal channel. The correction calculation module includes a first calculation unit and a second calculation unit. The first calculation unit is connected to the first adjustment module. The second calculation unit is connected to the second adjustment module, and the second calculation unit is further connected to an input end of the non-ideal channel.

The first calculation unit is configured to obtain the first adjustment parameter through calculation based on the output signal of the non-ideal channel and the drive signal. The second calculation unit is configured to obtain the second adjustment parameter through calculation based on an output signal and an input signal that belong to a same non-ideal channel.

It may be understood that the first calculation unit and the second calculation unit may be independent of each other and are not connected with a line, or the first calculation unit and the second calculation unit may be connected to each other with and exchange data, to cooperate with each other to more accurately calculate the first adjustment parameter and the second adjustment parameter.

FIG. 6 shows only one non-ideal channel. For a case of another non-ideal channel, refer to the case of the non-ideal channel shown in FIG. 4. That is, the second adjustment module on each non-ideal channel is connected to the second calculation unit. In some embodiments, there may be one second calculation unit, and the second calculation unit may be connected to a plurality of second adjustment modules and connected to input ends and output ends of the plurality of non-ideal channels. The second calculation unit obtains the second adjustment parameter through calculation based on the output signal and the input signal that belong to the same non-ideal channel; and then outputs, to the second adjustment module on the non-ideal channel, the second adjustment parameter obtained based on the signal of the non-ideal channel. In some embodiments, the correction calculation module may include a plurality of second calculation units. To be specific, one second calculation unit is configured for the second adjustment module on each non-ideal channel. One non-ideal channel is used as an example. A target second calculation unit is connected to an input end and an output end of a target non-ideal channel. The target second calculation unit is further connected to a target second adjustment module on the target non-ideal channel. The target second calculation unit obtains a second adjustment parameter through calculation based on an output signal and an input signal of the target non-ideal channel, and then outputs the second adjustment parameter to the target second adjustment module, so that the second adjustment module adjusts an error value on the target non-ideal channel based on the second adjustment parameter.

In some embodiments of this application, the second calculation unit may not be connected to the input end of the non-ideal channel. In this case, the second calculation unit cooperates with the first calculation unit, and obtains a second adjustment parameter applicable to the target non-ideal channel through calculation based on the drive signal and the output signal of the target non-ideal channel. For example, the second calculation obtains a preset output signal of the target non-ideal channel through calculation based on the drive signal; compares the preset output signal with an actual output signal of the non-ideal channel to obtain a value that needs to be adjusted; then obtains a correction parameter of the first calculation unit for the drive signal, for example, the first adjustment parameter; and obtains the second adjustment parameter through calculation based on the correction parameter and the value that needs to be adjusted.

In some embodiments of this application, when the first calculation unit and the second calculation unit are integrated on a same component, with reference to the foregoing description, the correction calculation module may be connected to the input end of each non-ideal channel, or may not be connected to the input end.

Correspondingly, in the correction method in the embodiment shown in FIG. 5, the step in which the correction calculation module obtains the first adjustment parameter and the second adjustment parameter through calculation based on the output signal of the non-ideal channel and the reference signal includes:

obtaining, by the first calculation unit, the first adjustment parameter through calculation based on the output signal of the non-ideal channel and the drive signal; and obtaining, by the second calculation unit, the second adjustment parameter through calculation based on the output signal and the input signal that belong to the same non-ideal channel.

The correction apparatus disposed in the separated manner can make the correction apparatus and the correction method provided in the embodiments of this application more flexible to implement and can facilitate circuit manufacturing.

The correction apparatus and the correction method in the embodiments of this application may be applied in a plurality of scenarios, for example, the foregoing described scenarios of nonlinearity, IQ imbalance, channel flatness, a channel delay error, a channel group delay ripple, and the like.

It may be understood that the correction apparatus in this embodiment of this application may be applied to devices such as a base station and a Wi-Fi (Wireless-Fidelity) router.

The correction apparatus in the embodiment shown in FIG. 4 may be applied to the HBF architecture. The correction apparatus and the correction method in the embodiments of this application are used in the HBF architecture, to improve output linearity and efficiency of a power amplifier.

In the HBF architecture, the correction apparatus and the correction method in the embodiments of this application have the following key points:

(1) The correction apparatus and the correction method are applicable to power amplifier predistortion in the HBF architecture and can support an architecture in which a quantity of digital transmit channels is far less than a quantity of PAs and a quantity of antenna channels.

(2) A function in which one correction channel supports linearization of a plurality of PAs can be implemented. In addition, performance is significantly higher than that of another solution.

(3) A system architecture/circuit solution design ensures consistency between a plurality of power amplifiers.

(4) Amplitude phase consistency of a transmit channel and a receive channel can be ensured through calibration, thereby ensuring an HBF beam direction and nulling performance.

For details, refer to the following descriptions.

When the correction apparatus shown in FIG. 4 is applied to the IMF architecture, the first adjustment module is a digital predistortion module, the second adjustment module is a nonlinear adjustment module, the correction calculation module is a hybrid beamforming HBF predistortion calculation module, the first adjustment parameter is a digital predistortion parameter, the second adjustment parameter is an analog nonlinear correction parameter, the drive signal is a digital I/Q complex signal, the non-ideal channel is an analog channel, and the channel signal is a radio frequency signal.

Figure 7A:
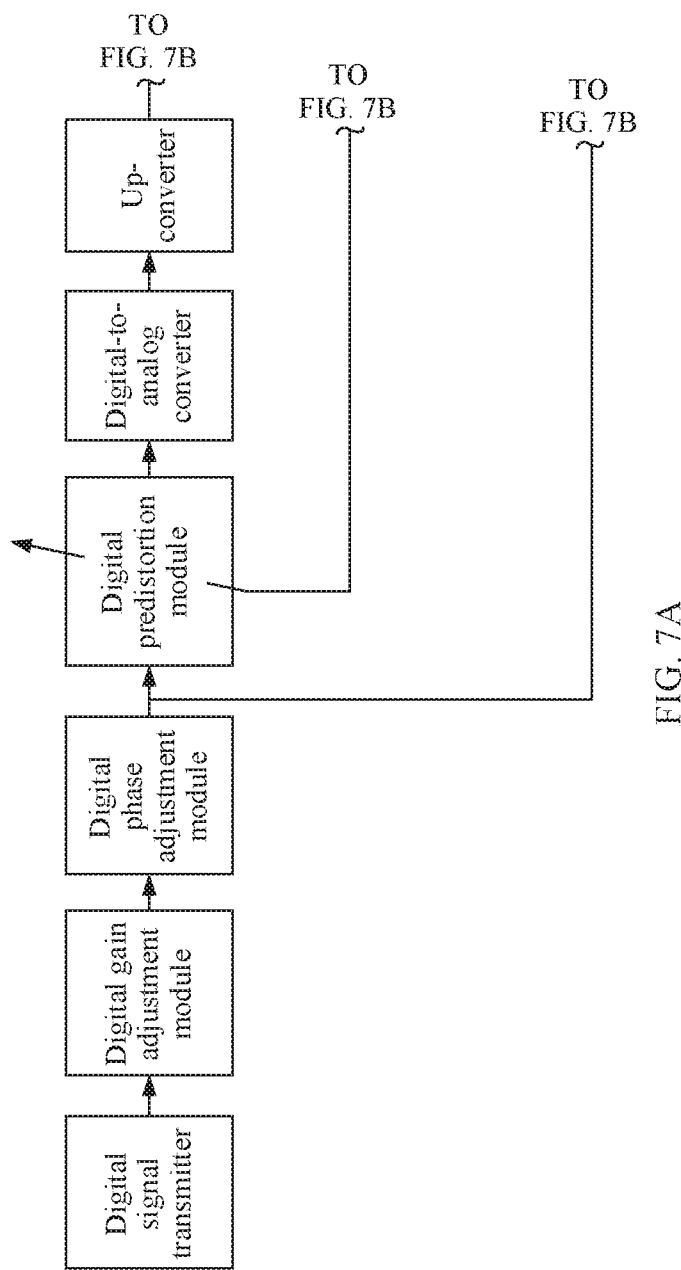
FIG. 7A and FIG. 7B are a schematic structural diagram of a correction apparatus according to another embodiment of this application.
Figure 7B:
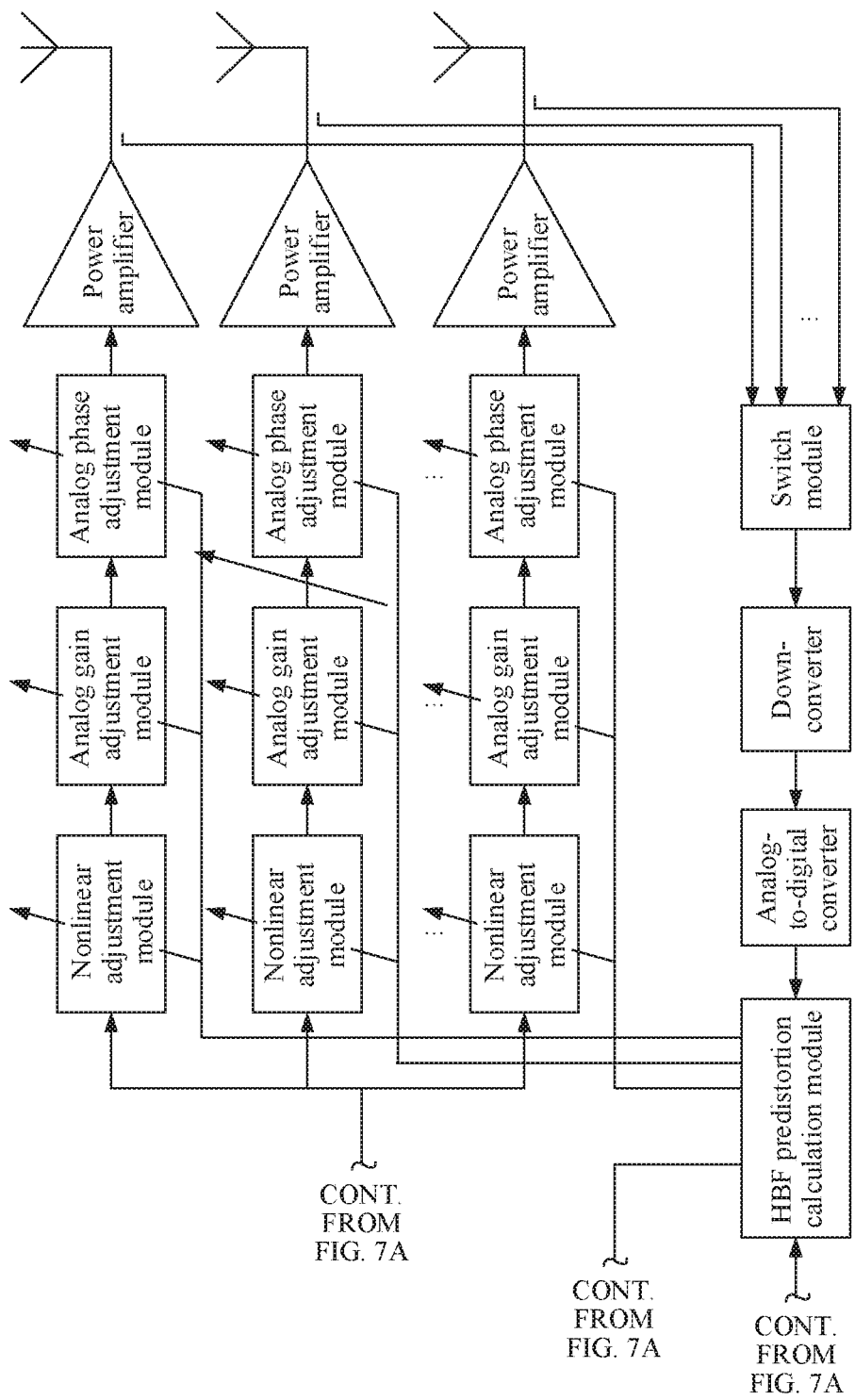

As shown in FIG. 7A and FIG. 7B, the correction apparatus includes a digital channel and a plurality of analog channels. The digital channel is separately connected to the plurality of analog channels. The correction apparatus further includes a correction channel. The correction channel may obtain an output signal of an analog channel.

A digital gain adjustment module, a digital phase adjustment module, a digital predistortion module, a digital-to-analog converter, and an up-converter are sequentially connected on the digital channel. An input end of the digital channel is connected to a digital signal transmitter, and an output end of the digital channel is connected to the plurality of analog channels. An input end of the digital-to-analog converter is connected to the digital predistortion module, and an output end of the digital-to-analog converter is separately connected to a plurality of nonlinear adjustment module. In this embodiment of this application, the digital-to-analog converter is connected to the plurality of nonlinear adjustment modules on the analog channels by using the up-converter.

It may be understood that a location of the digital gain adjustment module and that of the digital phase adjustment module may be changed on the digital channel.

The digital signal transmitter is configured to generate a digital I (in-phase, in-phase)/Q (quadrature) complex signal.

The digital gain adjustment module is configured to adjust a gain of the digital I/Q complex signal on the digital channel.

The digital phase adjustment module is configured to adjust a phase of the digital I/Q complex signal on the digital channel.

The digital predistortion module is configured to perform predistortion adjustment on the digital I/Q complex signal based on the digital predistortion parameter, to uniformly compensate for nonlinearity of a plurality of power amplifiers, and implement linearization of the power amplifiers.

The DAC (Digital-Analog Converter) is configured to convert a digital signal to an analog signal.

The up-converter is configured to convert an input signal with a specific frequency to an output signal with a higher frequency. Information content and a modulation scheme of a signal are usually not changed.

A nonlinear adjustment module, an analog gain adjustment module, an analog phase adjustment module, and a power amplifier are sequentially disposed on each analog channel. The analog gain adjustment module and the analog phase adjustment module are close to an input end of the power amplifier. The analog gain adjustment is connected to the HBF predistortion calculation module. The analog phase adjustment module is connected to the HBF predistortion calculation module.

One power amplifier is disposed on one analog channel. The power amplifier is connected to an output end of the nonlinear adjustment module. An output end of each power amplifier is further connected to an antenna. Each analog channel obtains a radio frequency signal from the digital channel. The nonlinear adjustment module, the analog gain adjustment module, and the phase adjustment module sequentially adjust the radio frequency signal, and then the power amplifier amplifies the radio frequency signal and outputs the radio frequency signal to the antenna. The output signal of the analog channel is the output signal of the power amplifier. Because the power amplifier has nonlinearity, the output signal of the power amplifier has nonlinear distortion. Therefore, the output signal of the power amplifier has an error value. In other words, a factor in generation of the error value of the output signal of the analog channel includes the nonlinearity of the power amplifier.

It may be understood that a sequence of the analog gain adjustment module, the analog phase adjustment module, and the nonlinear adjustment module may be adjusted on each analog channel.

The nonlinear adjustment module is configured to perform nonlinear adjustment on the radio frequency signal based on the analog nonlinear correction parameter, to compensate for a part that is of the nonlinearity of the power amplifier and that is not compensated by the digital predistortion module. In other words, the nonlinear adjustment module on each analog channel compensates again for the nonlinearity of the power amplifier that belongs to the same analog channel with the nonlinear adjustment module, to compensate for the part that is of the nonlinearity and that is not compensated by the digital predistortion module.

The analog gain adjustment module is configured to perform gain adjustment on the radio frequency signal based on the analog gain adjustment parameter, so that gain responses of radio frequency signals of different analog channels are consistent after the adjustment performed by the analog gain adjustment module.

The analog phase adjustment module is configured to perform phase adjustment on the radio frequency signal based on the analog phase adjustment parameter, so that phase responses of radio frequency signals of different analog channels are consistent after the adjustment performed by the analog phase adjustment module.

The power amplifier is configured to amplify and output a high-power radio frequency signal.

The correction apparatus further includes the correction channel. The correction channel includes the HBF predistortion calculation module, an analog-to-digital converter, a down-converter, and a switch module. The switch module is disposed between the HBF predistortion calculation module and output ends of the plurality of power amplifiers. Specifically, the switch module is coupled to the output end of each power amplifier, or is coupled to the last stage of antenna port of each analog channel. The down-converter is connected to the switch module. An input end of the analog-to-digital converter is connected to the down-converter, and an output end of the analog-to-digital converter is connected to the IMF predistortion calculation module. The HBF predistortion calculation module is further separately connected to the digital predistortion module, the nonlinear adjustment module, the analog gain adjustment module, and the analog phase adjustment module. The HBF predistortion calculation module may further obtain the digital I/Q complex signal input to the digital predistortion module.

The switch module is configured to: select an output signal of one of the plurality of analog channels in a time-division manner, and output the output signal of the power amplifier to the down-converter, so that the HBF predistortion calculation module obtains the output signal of the analog channel.

The down-converter is configured to: reduce a carrier frequency of a signal, or directly remove a carrier frequency to obtain a baseband signal.

The ADC (Analog-Digital Converter) is configured to convert an analog signal to a digital signal.

The HBF predistortion calculation module is configured to obtain parameters through calculation. The parameters may be different in different embodiments. For example, the HBF predistortion calculation module may obtain a digital predistortion parameter, an analog nonlinear correction parameter, an analog gain adjustment parameter, and an analog phase adjustment parameter through calculation. For details about the calculated parameters, refer to a correction method in the following embodiments.

A work procedure of the correction apparatus is as follows:

(1) Generation of a Drive Signal

The digital signal transmitter generates the digital I/Q complex signal, and the digital signal transmitter inputs the digital I/Q complex signal to the digital channel. The digital I/Q complex signal is the drive signal of the correction apparatus in this embodiment of this application.

(2) Transmission of the Drive Signal on the Digital Channel

On the digital channel, the digital gain adjustment module and the digital phase adjustment module adjust the digital I/Q complex signal, and then, the adjusted signal is separately input to the digital predistortion module and the HBF predistortion calculation module. The digital predistortion module performs predistortion adjustment on the obtained digital I/Q complex signal, to compensate for the nonlinearity of the power amplifiers on the plurality of analog channels connected to the digital predistortion module. Then, the digital predistortion module outputs the adjusted digital I/Q complex signal to the digital-to-analog converter, and the digital-to-analog converter converts the digital I/Q complex signal to an analog I/Q signal. Then, the up-converter performs up-conversion on the analog I/Q signal to obtain a radio frequency signal, and outputs the radio frequency signal to each analog channel. It may be learned that the radio frequency signal is obtained based on the digital I/Q complex signal adjusted by the digital predistortion module.

(3) Transmission of the Drive Signal on the Analog Channel

On each analog channel, the nonlinear adjustment module performs nonlinear adjustment on the obtained radio frequency signal, to further compensate for the nonlinearity of the power amplifier on the analog channel to which the nonlinear adjustment module belongs. The analog gain adjustment module further performs gain adjustment on the radio frequency signal adjusted by the nonlinear adjustment module, and the analog phase adjustment module performs phase adjustment on the radio frequency signal. Then, the radio frequency signal is input to the power amplifier. The power amplifier amplifies the radio frequency signal and outputs the radio frequency signal to the antenna. The antenna sends the signal. The power amplifier has nonlinearity. As an input power increases, nonlinear distortion generally occurs on the output signal. However, after the nonlinearity compensation performed by the digital predistortion module and the nonlinear adjustment module in advance, linearity of the signal output by the power amplifier is improved, to alleviate impact of the nonlinearity on radio frequency performance and maintain relatively high efficiency of the amplifier as much as possible.

(4) Work Procedure of the Correction Channel

To cooperate with adjustment operations of the adjustment modules, on the correction channel, a feedback signal is obtained by sampling the output signal of the power amplifier. In other words, the feedback signal is the output signal of the analog channel. Specifically, when the power amplifier outputs a signal, the output signal of the power amplifier on each analog channel is fed back to the switch module on the correction channel through coupling. In other words, the switch module collects and obtains the feedback signal of each analog channel. The feedback signal is obtained by collecting the output signal of the power amplifier. Then, the switch module outputs the collected feedback signal to the HBF predistortion calculation module in a time-division manner through the down-converter and the analog-to-digital converter, so that the HBF predistortion calculation module obtains the feedback signal. In this case, the feedback signal is adjusted by the down-converter, and the adjusted signal is converted to a digital signal by the analog-to-digital converter. In other words, the HBF predistortion calculation module obtains the feedback signal in a digital form. The HBF predistortion calculation module is further connected to an output end of the digital phase adjustment module, so that the predistortion calculation module further obtains the digital I/Q complex signal output by the digital phase adjustment module. The digital predistortion module is also connected to the output end of the digital phase adjustment module, to obtain the digital I/Q complex signal. Therefore, the digital I/Q complex signal obtained by the HBF predistortion calculation module is the same as the digital I/Q complex signal obtained by the digital predistortion module.

The HBF predistortion calculation module may obtain feedback signals of the plurality of analog channels and the digital I/Q complex signal input to the digital predistortion module. The HBF predistortion calculation module may be configured to obtain the digital predistortion parameter, the analog gain adjustment parameter, the analog phase adjustment parameter, and the analog nonlinear correction parameter through calculation.

Specifically, the HBF predistortion calculation module may obtain the digital predistortion parameter through calculation based on the feedback signal of any analog channel and the digital I/Q complex signal. The HBF predistortion calculation module outputs the digital predistortion parameter to the digital predistortion module, so that the digital predistortion module performs predistortion adjustment on the digital I/Q complex signal based on the digital predistortion parameter, to uniformly compensate for the nonlinearity of the plurality of power amplifiers. In this case, the digital predistortion module uniformly adjusts the nonlinearity of the plurality of power amplifiers connected to the digital predistortion module.

The HBF predistortion calculation module may further obtain the analog gain adjustment parameter and/or the analog phase adjustment parameter through calculation based on the feedback signal. For example, the analog gain adjustment parameter and the analog phase adjustment parameter may be obtained through calculation based on the obtained feedback signals of the plurality of analog channels, or the analog gain adjustment parameter and the analog phase adjustment parameter may be obtained through calculation based on the obtained digital I/Q complex signal and the feedback signal. For a specific implementation process, refer to the following corresponding description. Then, the HBF predistortion calculation module outputs the analog gain adjustment parameter to the analog gain adjustment module, so that the analog gain adjustment module performs gain adjustment on the radio frequency signal based on the analog gain adjustment parameter; and the IMF predistortion calculation module outputs the analog phase adjustment parameter to the analog phase adjustment module, so that the analog phase adjustment module performs phase adjustment on the radio frequency signal based on the analog phase adjustment parameter. In this way, in an architecture of combining the single digital channel and the plurality of analog channels, gain correction and phase correction for the plurality of analog channels may be implemented, thereby ensuring a beam direction and nulling performance.

The HBF predistortion calculation module may further obtain the nonlinear correction parameter through calculation, may obtain the nonlinear correction parameter through calculation based on the digital I/Q complex signal and the feedback signal of the analog channel, or may obtain the nonlinear correction parameter through calculation based on an input signal and an output signal that belong to a same analog channel. For a specific calculation process, refer to the description in the foregoing embodiment.

The HBF predistortion calculation module may be implemented in an integrated manner, or in a separated manner. In an embodiment of the separated manner, the HBF predistortion calculation module includes a first calculation unit and a second calculation unit. The first calculation unit is connected to the digital predistortion module. The second calculation unit is connected to the nonlinear adjustment module, and the second calculation unit is further connected to the input end of each analog channel. The first calculation unit is configured to obtain the digital predistortion parameter through calculation based on the output signal of the analog channel and the digital I/Q complex signal. The second calculation unit is configured to obtain the analog nonlinear correction parameter through calculation based on an output signal and an input signal that belong to a same analog channel. In other words, the IMF predistortion calculation module may obtain the digital predistortion parameter and the analog nonlinear correction parameter through calculation by using two different calculation modules. In this case, the first calculation module and the second calculation module may not be connected to each other.

In some embodiments, the first calculation unit and the second calculation unit may alternatively be connected to each other to exchange data. When the first calculation unit interacts with the second calculation unit, the two calculation modules perform joint processing to obtain better performance. For example, a compensation parameter for the first adjustment module may be learned when a parameter for the second adjustment module is calculated. In this case, during calculation modeling, a response for this part may be added, so that joint calculation can achieve a better nonlinear correction effect.

In this way, the digital predistortion parameter and the analog nonlinear correction parameter that are obtained through calculation are more accurate.

The power amplifier has nonlinearity. The correction apparatus provided in this embodiment of this application can compensate for the nonlinearity of the power amplifier, that is, perform a linearization operation on the power amplifier. Input signals of the plurality of analog channels come from the same digital channel. Therefore, on the digital channel, after the digital predistortion module adjusts the digital I/Q complex signal, signals obtained by the power amplifiers on the plurality of analog channels all come from signals output after the adjustment performed by the digital predistortion module. The digital predistortion module may uniformly adjust the nonlinearity of the plurality of power amplifiers connected to the digital predistortion module on the digital channel, to improve efficiency of nonlinearity compensation.

However, each analog channel may be subject to a different noise factor. For example, power amplifiers on different analog channels are in different ambient temperatures. Therefore, the different power amplifiers have different nonlinearity. The digital predistortion module uniformly adjusts, on the digital channel, the nonlinearity of the plurality of different power amplifiers, and differences between the nonlinearity of the different power amplifiers cannot be adjusted by the digital predistortion module. However, the nonlinear adjustment module may perform nonlinearity compensation again for the power amplifier on the analog channel to which the nonlinear adjustment module belongs. Specifically, the nonlinear adjustment module performs, based on the analog nonlinear adjustment parameter, nonlinear adjustment on the radio frequency signal obtained by the analog channel to which the nonlinear adjustment module belongs, to compensate for a difference of the nonlinearity of the power amplifier on the analog channel. The difference of the nonlinearity is a part that is of the nonlinearity of the power amplifier and that is not compensated by the digital predistortion module, namely, nonlinearity that is of the power amplifier on the analog channel and that is not compensated after the adjustment performed by the digital predistortion module. In this way, on each analog channel, the nonlinear adjustment module may further compensate for the nonlinearity of the power amplifier on the analog channel.

The nonlinear adjustment module performs nonlinearity compensation on the radio frequency signal based on the analog nonlinear correction parameter, to further compensate for the nonlinearity of the power amplifier on this analog channel after the compensation performed by the digital predistortion module. After the adjustment performed by the nonlinear adjustment module, the differences that are of the nonlinearity of the power amplifiers on the different analog channels and that are not compensated by the digital predistortion module are compensated, to improve an effect of nonlinearity compensation.

In this way, according to the correction apparatus in this embodiment of this application, compensation efficiency is improved, and the nonlinearity of each power amplifier is adaptively compensated, to improve accuracy of nonlinearity compensation. To be specific, in the architecture of combining the single digital channel and the plurality of analog channels, nonlinear distortion of the plurality of analog channels in HBF can be corrected with high performance, and nonlinear correction performance and consistency performance of PAs on a plurality of channels can be ensured. In addition, according to the correction apparatus in this embodiment of this application, hardware implementation resources are greatly reduced. In comparison with a conventional DBF calibration solution, in the HBF architecture, a requirement for a quantity of digital channels is lowered. The quantity of digital channels may be far less than a quantity of PAs and a quantity of antennas at a front end.

In addition, according to the correction apparatus in this embodiment of this application, a complex model is decomposed into a single-channel digital predistortion model and a multi-channel analog nonlinear model, that is, decomposed into a digital channel for digital predistortion adjustment and a plurality of analog channels for nonlinear adjustment, thereby reducing global modeling complexity of the correction apparatus. In a model decomposition manner, a global optimal convergence solution is avoided, and DPD modeling resources can be further reduced. The correction apparatus in this embodiment of this application can compensate for differences between different PAs, and final correction performance is better than that of the global optimal convergence solution.

The switch module that collects the output signals of the power amplifiers through coupling in a time-division manner is disposed, so that time-division feedback of the plurality of power amplifiers can be implemented. When a quantity of hardware channels is reduced, the correction apparatus in this embodiment of this application can still obtain ideal correction performance.

In some embodiments of this application, the correction apparatus may not include the analog gain adjustment module or the analog phase adjustment module, or includes either the analog gain adjustment module or the analog phase adjustment module.

In some embodiments of this application, the correction apparatus may not include the up-converter or the down-converter. For example, a digital-to-analog converter with a high sampling rate directly converts a digital signal to a radio frequency signal, and the up-converter is not needed. Alternatively, an analog-to-digital converter with a high sampling rate directly converts a radio frequency signal to a digital signal, and the down-converter is not needed.

In some embodiments of this application, a plurality of correction apparatuses in foregoing embodiment may be integrated. To be specific, in some embodiments of this application, the correction apparatus may include a plurality of drive channels, where each drive channel is connected to a plurality of non-ideal channels, one drive channel and the plurality of non-ideal channels connected to the drive channel form a unit, and the unit is the correction apparatus in the embodiment shown in FIG. 4. For example, the correction apparatus includes a plurality of digital channels, each digital channel is connected to a plurality of analog channels, and one digital channel and the plurality of analog channels connected to the digital channel form the correction apparatus in the embodiment shown in FIG. 7A and FIG. 7B.

In conclusion, the digital predistortion module can implement high-performance nonlinear correction for the plurality of analog channels, the plurality of nonlinear adjustment modules can implement correction on nonlinearity differences between the PAs on the plurality of analog channels, and the plurality of analog gain adjustment modules and the plurality of analog phase adjustment modules can implement gain calibration and phase calibration for the plurality of analog channels.

For manners for calculating some parameters in the foregoing correction apparatus, refer to the following description. The foregoing parameters are mainly calculated by the correction calculation module or the HBF predistortion calculation module.

Figure 8:
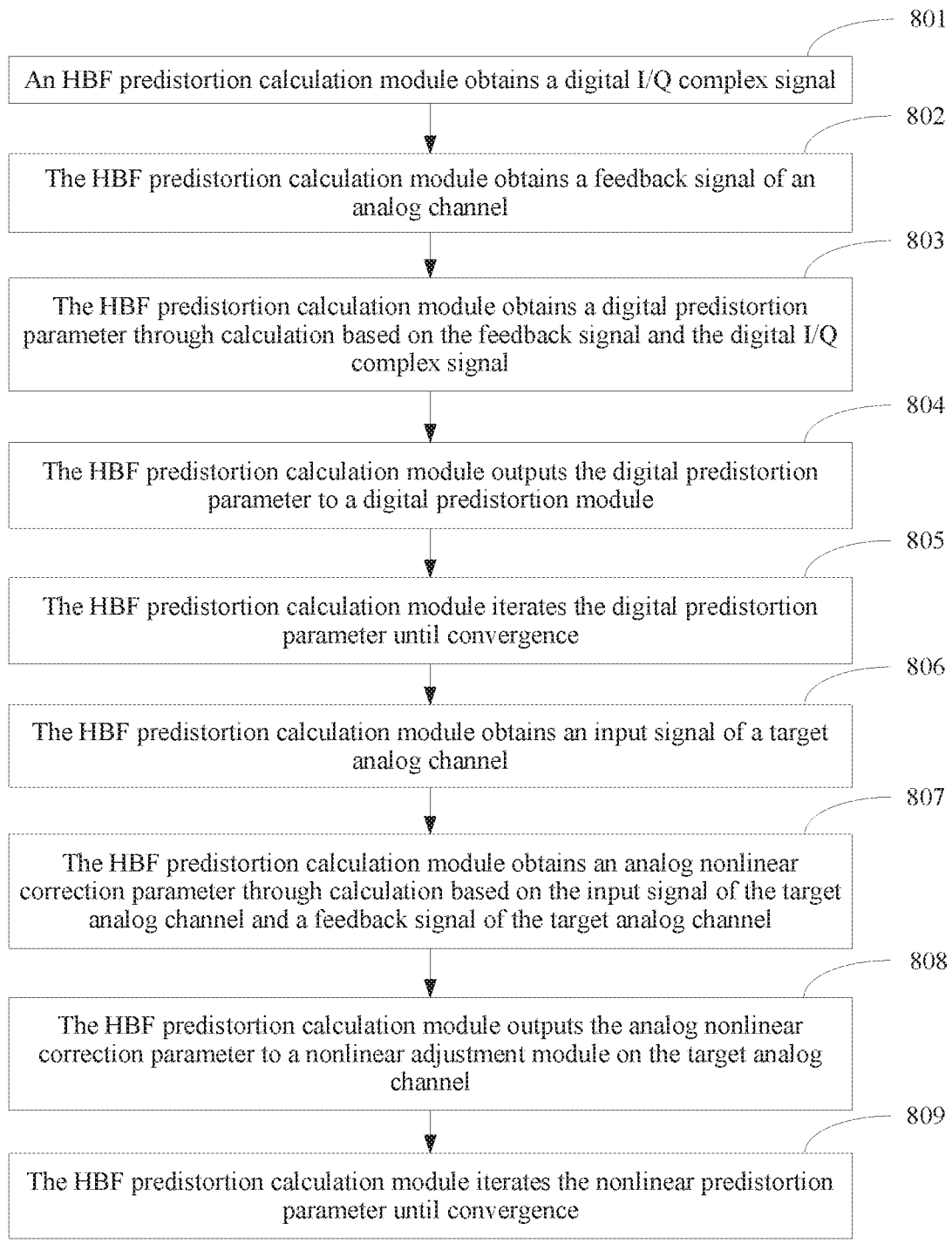
FIG. 8 is a method flowchart of a correction method according to another embodiment of this application.

Referring to FIG. 8, an embodiment of this application further provides a correction method. The correction method in this embodiment of this application is described by using an HBF architecture of nonlinear imbalance. For the correction method, refer to the content shown in the embodiment shown in FIG. 7A and FIG. 7B.

The correction method in this embodiment of this application is a specific implementation of the correction method in FIG. 5. In comparison with the correction method in the embodiment of FIG. 5, in the embodiment shown in FIG. 8, a first adjustment module is a digital predistortion module, a second adjustment module is a nonlinear adjustment module, a correction calculation module is a hybrid beamforming HBF predistortion calculation module, a first adjustment parameter is a digital predistortion parameter, a second adjustment parameter is an analog nonlinear correction parameter, a drive signal is a digital I/Q complex signal, a non-ideal channel is an analog channel, and a channel signal is a radio frequency signal.

To be specific, the correction method in this embodiment of this application is applied to the hybrid beamforming HBF predistortion calculation module in a correction apparatus. The correction apparatus includes the digital predistortion module, a plurality of nonlinear adjustment modules, the HBF predistortion calculation module, and a plurality of analog channels. One nonlinear adjustment module is disposed on one analog channel. The digital predistortion module is connected to each analog channel. The HBF predistortion calculation module is separately connected to the digital distortion module and the plurality of nonlinear adjustment module. The HBF predistortion calculation module is connected to an output end of each analog channel. For more details of description of the correction apparatus, refer to the embodiment shown in FIG. 7A and FIG. 7B.

Referring to FIG. 8, the method in this embodiment of this application includes the following steps:

Step 801: The HBF predistortion calculation module obtains the digital I/Q complex signal.

The HBF predistortion calculation module may obtain the digital I/Q complex signal. The digital I/Q complex signal is the same as a digital I/Q complex signal obtained by the digital predistortion module.

For example, as shown in FIG. 7A and FIG. 7B, the HBF predistortion calculation module is connected to an output end of the digital phase adjustment module. The output end of the digital phase adjustment module is further connected to the digital predistortion module, so that the digital phase adjustment module can output the digital I/Q complex signal to the digital predistortion module and the HBF predistortion calculation module.

Step 802: The HBF predistortion calculation module obtains a feedback signal of an analog channel.

The feedback signal of the analog channel is an output signal of the analog channel. In this embodiment of this application, the output signal of the analog channel is an output signal of a power amplifier. Because the power amplifier has nonlinearity, the output signal of the power amplifier has an error value.

Specifically, the feedback signal is obtained by sampling the output signal of the analog channel, A correction channel is connected to the plurality of analog channels. The HBF predistortion calculation module on the correction channel may obtain feedback signals of the plurality of analog channels.

In some embodiments, the HBF predistortion calculation module needs to calculate the nonlinear correction parameter based on the feedback signal. Nonlinear adjustment modules on different analog channels need to adjust radio frequency signals based on different nonlinear correction parameters. Therefore, to obtain a nonlinear correction parameter applicable to an analog channel through calculation, the HBF predistortion calculation module needs to obtain a feedback signal of the analog channel. In other words, the HBF predistortion calculation module needs to calculate different analog nonlinear correction parameters based on feedback signals of different analog channels. For example, to obtain a nonlinear correction parameter applicable to a target analog channel through calculation in step 807, the HBF predistortion calculation module needs to obtain a feedback signal of the target analog channel in step 802. The target analog channel is one of the plurality of analog channels.

In sonic embodiments, the HBF predistortion calculation module needs to calculate the digital predistortion parameter based on the feedback signal. The digital predistortion module may uniformly perform, based on the digital predistortion parameter, nonlinearity compensation for the plurality of power amplifiers connected to the digital predistortion module. In this case, the feedback signal obtained by the HBF predistortion calculation module may be a feedback signal of any one of the plurality of analog channels.

Step 803: The HBF predistortion calculation module obtains the digital predistortion parameter through calculation based on the feedback signal and the digital I/Q complex signal.

After obtaining the digital I/Q complex signal and the feedback signal, the HBF predistortion calculation module may obtain the digital predistortion parameter through calculation based on the two signals.

A specific calculation method may be: The HBF predistortion calculation module obtains an ideal output signal of the power amplifier through calculation based on the digital I/Q complex signal. The ideal output signal may be a signal with a preset value, and the feedback signal is an output signal actually output by the power amplifier. Then, the ideal output signal is compared with the obtained feedback signal to obtain a comparison result. The digital predistortion parameter may be obtained through calculation based on the comparison result. The digital predistortion module performs reverse compensation on the digital I/Q complex signal in advance based on the digital predistortion parameter, so that the digital I/Q complex signal passes through the digital predistortion module and then passes through the power amplifier, and the output signal of the power amplifier can obtain a linear amplification result.

Step 804: The HBF predistortion calculation module outputs the digital predistortion parameter to the digital predistortion module.

After obtaining the digital predistortion parameter through calculation, the HBF predistortion calculation module outputs the digital predistortion parameter to the digital predistortion module, so that the digital predistortion module performs predistortion adjustment on the digital I/Q complex signal based on the digital predistortion parameter, to uniformly compensate for nonlinearity of the plurality of power amplifiers.

Step 805: The HBF predistortion calculation module iterates the digital predistortion parameter until convergence.

The HBF predistortion calculation module outputs the digital predistortion parameter to the digital predistortion module, and then a digital predistortion parameter of the digital predistortion module may be updated. The digital predistortion parameter initially obtained by the IMF predistortion calculation module through calculation may have no enough precision. Predistortion adjustment performed on the digital I/Q complex signal by the digital predistortion module based on the digital predistortion parameter that has no enough precision may be not ideal. In this case, the HBF predistortion calculation module needs to perform calculation for a plurality of times based on the feedback signals and the digital I/Q complex signal, to obtain a plurality of digital predistortion parameters, so that the digital predistortion module obtains digital predistortion parameters for a plurality of times to perform predistortion adjustment for a plurality of times. In other words, the HBF predistortion calculation module repeats the foregoing step 801 to step 805, to achieve a best linearization effect of the power amplifiers.

It may be understood that step 805 may be not included in some embodiments.

Step 801 to step 805 are a manner of obtaining the digital predistortion parameter. The HBF predistortion calculation module calculates the digital predistortion parameter. The digital predistortion module may obtain the digital predistortion parameter from the HBF predistortion calculation module, to perform predistortion adjustment on the obtained digital I/Q complex signal based on the digital predistortion parameter. The digital predistortion parameter is calculated based on the feedback signal and the digital I/Q complex signal. The feedback signal is the output signal of the power amplifier. A signal amplified by the power amplifier comes from the digital I/Q complex signal, so that the predistortion adjustment performed by the digital predistortion module based on the digital predistortion parameter corresponds to predistortion characteristics of the power amplifier. The radio frequency signals obtained on the plurality of analog channels come from the same digital I/Q complex signal. Therefore, the nonlinearity of the plurality of power amplifiers connected to the digital predistortion module are compensated through predistortion adjustment performed by the digital predistortion module.

In some embodiments of this application, a specific implementation of calculating the digital predistortion parameter by the IMF predistortion calculation module may alternatively be implemented in the following manner. To be specific, in step 802, the HBF predistortion calculation module obtains an output signal of any analog channel. In step 803, the HBF predistortion calculation module obtains the digital predistortion parameter through calculation based on the output signal of any analog channel and the digital I/Q complex signal. In other words, the IMF predistortion calculation module can obtain the digital predistortion parameter through calculation based on the feedback signal of any analog channel and the digital I/Q complex signal, without obtaining the feedback signals of all the analog channels.

For example, as shown in FIG. 7A and FIG. 7B, a switch module performs selection in a time-division manner. The switch module may collect an output signal of a power amplifier on any channel as a feedback signal. The collected feedback signal passes through a down-converter and an analog-to-digital converter and then is output to the HBF predistortion calculation module, so that the HBF predistortion calculation module obtains a feedback signal of any analog channel.

One digital channel corresponds to a plurality of analog channels. The radio frequency signal input to the plurality of analog channels comes from the digital I/Q complex signal on the digital channel. In this case, the digital predistortion module on the digital channel performs predistortion adjustment on the obtained digital I/Q complex signal based on the digital predistortion parameter, and implements uniform compensation for the nonlinearity of the power amplifiers on the plurality of analog channels, that is, compensates for a same part of the nonlinearity of the power amplifiers on the different analog channels. Because a feedback signal of a power amplifier on any analog channel includes the same part of the nonlinearity, the HBF predistortion calculation module may obtain the needed digital predistortion parameter based on the feedback signal of any power amplifier.

The foregoing describes a specific method for calculating a digital predistortion parameter. According to the correction apparatus in this embodiment of this application, the nonlinear adjustment module to needs to perform nonlinearity compensation for the power amplifier for the second time. The nonlinear adjustment module obtains the nonlinear correction parameter from the HBF predistortion calculation module. In this case, the HBF predistortion calculation module further needs to perform the following steps:

Step 806: The HBF predistortion calculation module obtains an input signal of the target analog channel.

To obtain, through calculation, analog nonlinear correction parameters corresponding to different power amplifiers, the HBF predistortion calculation module needs to perform specific calculation based on parameters of different analog channels. The input signal of the analog channel may be a radio frequency signal input to the analog channel. The target analog channel is one of the plurality of analog channels connected to the digital channel.

A manner in which the HBF predistortion calculation module obtains the input signal may be: The HBF predistortion calculation module is coupled to an input end of the analog channel to collect the input signal of the analog channel.

It may be understood that, according to the correction method in this embodiment of this application, output signals of the plurality of analog channels need to be obtained to compensate for the nonlinearity of the power amplifiers on the plurality of analog channels. Because analog channels may be different, power amplifiers on the analog channels have different nonlinearity. To compensate for differences between the nonlinearity of the power amplifiers on the different analog channels, an output signal and an input signal that belong to a same analog channel need to be obtained, to obtain a nonlinear correction parameter applicable to the analog channel based on the output signal and the input signal that belong to the same analog channel. For accurate description, this embodiment shown in FIG. 8 describes one of the plurality of analog channels. The selected analog channel is referred to as the target analog channel. The HBF predistortion calculation module further needs to calculate a nonlinear correction parameter for another analog channel. A process of calculating the nonlinear correction parameter for the another analog channel is the same as a process of calculating the nonlinear correction parameter for the target analog channel. Another case may be analogous thereto.

Step 807: The HBF predistortion calculation module obtains the analog nonlinear correction parameter through calculation based on the input signal of the target analog channel and the feedback signal of the target analog channel.

A specific calculation method may be: The HBF predistortion calculation module obtains the ideal output signal of the power amplifier on the target analog channel through calculation based on the input signal of the target analog channel. The ideal output signal may be a signal with a preset value. The feedback signal of the target analog channel is the output signal of the power amplifier. Then, the HBF predistortion calculation module compares the ideal output signal with the feedback signal, to obtain a comparison result. The analog nonlinear correction parameter is obtained through calculation based on the comparison result. The nonlinear adjustment module may adjust the radio frequency signal of the target analog channel based on the analog nonlinear correction parameter, so that the signal output by the power amplifier based on the adjusted radio frequency signal obtains a linearization effect.

For example, in sonic embodiments of this application, step 807 includes the following steps.

Step A1: The HBF predistortion calculation module obtains a difference value through calculation based on the output signal and the input signal that belong to the same analog channel.

The difference value is a difference between the output signal of the power amplifier on the analog channel and the preset output signal in step A1. The output signal of the power amplifier is the output signal of the analog channel. The output signal of the power amplifier is an actual output signal. The preset output signal is a linearized output signal of the power amplifier, and may be an ideal output signal. The preset output signal may be obtained through calculation based on the input signal of the analog channel. The difference value obtained in such a way reflects a degree to which the radio frequency signal of the analog channel is to be adjusted.

Step A2: The HBF predistortion calculation module obtains the analog nonlinear correction parameter through calculation by applying a cascaded predistortion PD model to the difference value.

After obtaining the difference value, the HBF predistortion calculation module obtains the analog nonlinear correction parameter through calculation based on the difference value, and outputs the nonlinear correction parameter to the nonlinear adjustment module, so that the nonlinear adjustment module performs, based on an indication of the analog nonlinear correction parameter, predistortion adjustment on the radio frequency signal on the analog channel to which the nonlinear adjustment module belongs.

Step 808: The HBF predistortion calculation module outputs the analog nonlinear correction parameter to the nonlinear adjustment module on the target analog channel.

After obtaining the nonlinear correction parameter through calculation, the predistortion calculation module outputs the nonlinear correction parameter to the nonlinear adjustment module on the target analog channel, so that the nonlinear adjustment module performs nonlinear adjustment on the radio frequency signal based on the analog nonlinear correction parameter, to compensate for the part that is of the nonlinearity of the power amplifier on the target analog channel and that is not compensated by the digital predistortion module.

Step 809: The HBF predistortion calculation module iterates the nonlinear correction parameter until convergence.

In some embodiments of this application, the HBF predistortion calculation module needs to iterate the nonlinear correction parameter until convergence, to make the nonlinear correction parameter obtained by the HBF predistortion calculation module through calculation more accurate, so that a better linearization effect is obtained based on the nonlinear correction parameter.

The HBF predistortion calculation module outputs the nonlinear correction parameter to the nonlinear adjustment module, and then a nonlinear correction parameter of the nonlinear adjustment module may be updated. The nonlinear correction parameter initially obtained by the HBF predistortion calculation module through calculation may have no enough precision. Nonlinear adjustment performed on the radio frequency signal by the nonlinear adjustment module based on the nonlinear correction parameter that has no enough precision may be not ideal. In this case, the HBF predistortion calculation module needs to perform calculation for a plurality of times based on the input signal and the feedback signal, to obtain a plurality of nonlinear correction parameters, so that the nonlinear adjustment module obtains nonlinear correction parameters for a plurality of times to perform nonlinear adjustment for a plurality of times. In other words, the HBF predistortion calculation module repeats the foregoing step 802 in which the HBF predistortion calculation module obtains the feedback signal of the target analog channel, and step 806 to step 808, to achieve a best linearization effect of the power amplifiers.

Step 809 may be not included in some embodiments of this application.

The foregoing step 802 and step 806 to step 809 are separately performed for different analog channels. In this way, the HBF predistortion calculation module can obtain the analog nonlinear correction parameter through calculation based on the output signal and the input signal that belong to the same analog channel, and output the analog nonlinear correction parameter to the nonlinear adjustment module on the analog channel.

In this way, by performing the correction method in this embodiment of this application, the HBF predistortion calculation module can obtain the digital predistortion parameter and the analog nonlinear correction parameter through calculation. Therefore, the digital predistortion module adjusts a signal based on the digital predistortion parameter, to compensate for the nonlinearity of the plurality of power amplifiers; the nonlinear adjustment module adjusts, based on the analog nonlinear correction parameter, the radio frequency signal of the analog channel on which the digital predistortion module is located, to further compensate for the nonlinearity of the power amplifier on the analog channel.

In some embodiments of this application, the HBF predistortion calculation module may obtain the digital predistortion parameter and the analog nonlinear correction parameter through calculation by using a same component, or may separately obtain the digital predistortion parameter and the analog nonlinear correction parameter through calculation by using separate components. For example, For example, the HBF predistortion calculation module includes a first calculation unit and a second calculation unit. The first calculation unit is connected to the digital predistortion module. The second calculation unit is connected to the nonlinear adjustment module, and the second calculation unit is further connected to an input end of each analog channel.

In this case, that the HBF predistortion calculation module obtains the output signal of the analog channel and the reference signal includes: The first calculation unit obtains the output signal of the analog channel and the digital I/Q complex signal; and the second calculation unit obtains the output signal of the analog channel and the input signal of the analog channel. In other words, different parameters are separately obtained by using the first calculation unit and the second calculation unit.

Therefore, the digital predistortion parameter and the analog nonlinear correction parameter are separately calculated by different calculation units. For example, the first calculation unit obtains the digital predistortion parameter through calculation based on the output signal of the analog channel and the digital I/Q complex signal; and the second calculation unit obtains the analog nonlinear correction parameter through calculation based on the output signal and the input signal that belong to the same analog channel.

The step in which the second calculation unit obtains the analog nonlinear correction parameter through calculation based on the output signal and the input signal that belong to the same analog channel may include: The second calculation unit obtains the difference value through calculation based on the output signal and the input signal that belong to the same analog channel; and the second calculation unit obtains the analog nonlinear correction parameter by applying the cascaded predistortion PD model to the difference value.

It may be understood that, in the foregoing correction method, to obtain the analog nonlinear correction parameter through calculation, the input signal of the analog channel and the output signal of the analog channel are used. In some embodiments, the analog nonlinear correction parameter may be calculated by using the digital I/Q complex signal on the digital channel and the output signal of the analog channel. The digital I/Q complex signal is the same as the digital I/Q complex signal used to calculate the digital predistortion parameter.

To be specific, referring to the embodiment shown in FIG. 8, in some embodiments of this application, the correction method may not include step 806. An implementation of step 807 is: The HBF predistortion calculation module obtains the analog nonlinear correction parameter through calculation based on the digital I/Q complex signal and the feedback signal of the target analog channel. Then, the analog nonlinear correction parameter may be output to the nonlinear adjustment module on the target analog channel.

In conclusion, the HBF predistortion calculation module may obtain the analog nonlinear parameter through calculation based on the output signal of the analog channel and the reference signal. The reference signal may be the digital I/Q complex signal or the input signal of the analog channel.

In some embodiments of this application, on each analog channel, the correction apparatus further includes an analog gain adjustment module and/or an analog phase adjustment module. The analog gain adjustment module and/or the analog phase adjustment module are/is close to an input end of the power amplifier. The analog gain adjustment module is connected to the HBF predistortion calculation module, and the analog phase adjustment module is connected to the HBF predistortion calculation module.

In this case, the correction method in this embodiment of this application further includes the following steps:

Step B1: The HBF predistortion calculation module obtains an analog gain adjustment parameter and/or an analog phase adjustment parameter through calculation based on the output signal of the analog channel.

Step B2: The HBF predistortion calculation module outputs the analog gain adjustment parameter to the analog gain adjustment module, so that the analog gain adjustment module performs gain adjustment on the radio frequency signal based on the analog gain adjustment parameter.

Step B3: The HBF predistortion calculation module outputs the analog phase adjustment parameter to the analog phase adjustment module, so that the analog phase adjustment module performs phase adjustment on the radio frequency signal based on the analog phase adjustment parameter.

The analog gain adjustment module performs gain adjustment on the radio frequency signal and can compensate for a gain difference of each analog channel, so that gains of the analog channels are consistent. The analog phase adjustment module performs phase adjustment on the radio frequency signal and compensates for a phase difference of each analog channel, so that phases of the analog channels are consistent. Through work of the analog gain adjustment module and the analog phase adjustment module, amplitude phase calibration for the plurality of analog channels connected to the single digital channel can be completed.

Specifically, the analog gain adjustment parameter and the analog phase adjustment parameter may be implemented in the following manners.

(1) Analog Gain Adjustment Parameter

The analog gain adjustment is to make gains of different analog channels consistent. The analog gain adjustment parameter is specifically obtained in a plurality of manners. Two examples of the manners are listed herein.

Example 1: Calculated Based on the Feedback Signal

Step C1: The HBF predistortion calculation module obtains the feedback signals of the plurality of analog channels.

The HBF predistortion calculation module may obtain feedback signals of different analog channels in the foregoing described manner, for example, obtain the feedback signals of the different analog channels in a time-division manner by using the switch module.

Step C2: The HBF predistortion calculation module calculates gain values of different analog channels based on each feedback signal.

Step C3: The HBF predistortion calculation module calculates the analog gain adjustment parameter of the analog channel based on the plurality of gain values.

After obtaining the gain values of the plurality of analog channels, the HBF predistortion calculation module compares the plurality of gain values, and calculates analog gain adjustment parameters belonging to different analog channels.

Step C4: The HBF predistortion calculation module outputs the analog gain adjustment parameters to analog gain adjustment modules on the different analog channels.

After obtaining, through calculation, the analog gain parameters belonging to the different analog channels, the HBF predistortion calculation module outputs the analog gain parameters of the different analog channels to the analog gain adjustment modules on the corresponding analog channels. In this way, after the analog gain adjustment module performs gain adjustment on the radio frequency signal based on the obtained gain adjustment parameter, the gain values of the different analog channels are the same.

Example 2: Calculated Based on the Feedback Signal and the Digital I/Q Complex Signal Step D1: The HBF predistortion calculation module obtains the digital I/Q complex signal.

The HBF predistortion calculation module obtains the digital I/Q complex signal before the digital predistortion module. Radio frequency signals of the plurality of analog channels come from the digital I/Q complex signal.

Step D2: The HBF predistortion calculation module obtains the feedback signals of the plurality of analog channels.

The HBF predistortion calculation module obtains the feedback signals of the plurality of analog channels. The plurality of feedback signals come from the digital I/Q complex signal in the foregoing step D1.

For example, at the output end of the power amplifier, the correction channel collects the feedback signal of each analog channel, and the feedback signal is selected in a time-division manner by using the switch module, and is input to the HBF predistortion calculation module after being processed by the down-converter and the digital-to-analog converter.

Step D3: The HBF predistortion calculation module obtains the analog gain adjustment parameter of each analog channel through calculation based on the feedback signal and the digital I/Q complex signal.

The HBF predistortion calculation module performs calculation based on the plurality of feedback signals by using the digital I/Q complex signal as the reference signal, to obtain the plurality of gain adjustment parameters through calculation. Different analog channels correspond to different gain adjustment parameters.

Step D4: The HBF predistortion calculation module outputs the analog gain adjustment parameter to the analog gain adjustment module.

The HBF predistortion calculation module outputs the corresponding analog gain adjustment parameters to the analog gain adjustment modules on the analog channels. After obtaining the analog gain adjustment parameter, the analog gain adjustment module performs analog gain adjustment on the radio frequency signal on the analog channel based on the analog gain adjustment parameter, to compensate for an analog gain difference, so that analog gains of radio frequency signals of different analog channels are consistent.

(2) Analog Phase Adjustment Parameter

The analog phase adjustment is to make phases of different analog channels consistent. The analog phase adjustment parameter is specifically obtained in a plurality of manners. Two examples of the manners are listed herein.

Example 1: Calculated Based on the Feedback Signal

Step E1: The HBF predistortion calculation module obtains the feedback signals of the plurality of analog channels.

The HBF predistortion calculation module may obtain feedback signals of different analog channels in the foregoing described manner, for example, obtain the feedback signals of the different analog channels in a time-division manner by using the switch module.

Step E2: The HBF predistortion calculation module calculates phase values of different analog channels based on each feedback signal.

Step E3: The HBF predistortion calculation module calculates the analog phase adjustment parameter of the analog channel based on the plurality of phase values.

After obtaining the phase values of the plurality of analog channels, the HBF predistortion calculation module compares the plurality of phase values, and calculates analog phase adjustment parameters belonging to different analog channels.

Step E4: The HBF predistortion calculation module outputs the analog phase adjustment parameters to the analog phase adjustment modules on the different analog channels.

After obtaining, through calculation, the analog phase parameters belonging to the different analog channels, the HBF predistortion calculation module outputs the analog phase parameters of the different analog channels to the analog phase adjustment modules on the corresponding analog channels. In this way, after the analog phase adjustment module performs phase adjustment on the radio frequency signal based on the obtained phase adjustment parameter, the phase values of the different analog channels are the same.

Example 2: Calculated Based on the Feedback Signal and the Digital I/Q Complex Signal Step F1: The HBF predistortion calculation module obtains the digital I/Q complex signal.

The HBF predistortion calculation module obtains the digital I/Q complex signal of the digital predistortion module. Radio frequency signals of the plurality of analog channels come from the digital I/Q complex signal.

Step F2: The HBF predistortion calculation module obtains the feedback signals of the plurality of analog channels.

The HBF predistortion calculation module obtains the feedback signals of the plurality of analog channels. The plurality of feedback signals come from the digital I/Q complex signal in the foregoing step F1.

For example, at the output end of the power amplifier, the correction channel collects the feedback signal of each analog channel, and the feedback signal is selected in a time-division manner by using the switch module, and is input to the HBF predistortion calculation module after being processed by the down-converter and the digital-to-analog converter.

Step F3: The HBF predistortion calculation module obtains the analog phase adjustment parameter of each analog channel through calculation based on the feedback signal and the digital I/Q complex signal.

The HBF predistortion calculation module performs calculation based on the plurality of feedback signals by using the digital I/Q complex signal as the reference signal, to obtain the plurality of phase adjustment parameters through calculation. Different analog channels correspond to different phase adjustment parameters.

Step F4: The HBF predistortion calculation module outputs the analog phase adjustment parameter to the analog phase adjustment module.

The HBF predistortion calculation module outputs the corresponding analog phase adjustment parameters to the analog phase adjustment modules on the analog channels. After obtaining the analog phase adjustment parameter, the analog phase adjustment module performs analog phase adjustment on the radio frequency signal on the analog channel based on the analog phase adjustment parameter, to compensate for an analog phase difference, so that analog phases of radio frequency signals of different analog channels are consistent.

The foregoing implementation is completed online (in a system running process). In some embodiments of this application, obtaining the analog phase adjustment parameter and the analog gain adjustment parameter, and the analog phase adjustment and the analog gain adjustment may alternatively be completed in an offline static tabulating manner. For example, tests in different operating temperatures and states are conducted during equipment manufacturing (for each device or for a representative device, depending on consistency of processing devices), to record various compensation values. During actual work, a table is read based on an operating state reported by each sensor. Gain compensation and phase compensation are performed based on a table reading result. In the offline static tabulating implementation, the analog phase adjustment module and the analog gain adjustment module on each analog channel may not need to be connected to the HEW predistortion calculation module.

In conclusion, the correction apparatus in this embodiment of this application may adjust the phase and the gain for the analog channel, so that the output signals of the analog channels have the consistent phases and the consistent gains, to ensure a beam direction and nulling performance.

In some embodiments of this application, the correction apparatus further includes an amplitude phase correction module, a plurality of transmit channels, and a plurality of receive channels. The transmit channel and the receive channel each are connected to an antenna. The transmit channel is the foregoing analog channel. The transmit channel is used to transmit a radio frequency signal to the antenna. The receive channel is an analog channel used to receive an antenna signal. One end of the amplitude phase correction module is connected to a port of the antenna; and the other end of the amplitude phase correction module is connected to a channel on which a signal is output to the plurality of transmit channels, and the other end of the amplitude phase correction module is further connected to a channel on which a signal is obtained from the plurality of receive channels.

The amplitude phase correction module is configured to: perform amplitude phase calibration on the plurality of transmit channels, and perform amplitude phase calibration on the plurality of receive channels.

A specific amplitude phase calibration procedure is as follows:

Calibration of a transmit channel is used as an example. Calibration for a plurality of channels may be implemented by gradually enabling the transmit channels. The first two transmit channels are enabled, and then corresponding phase weights are adjusted to maximize and minimize down-converted signals. It may be considered that in this case, phase differences of a channel 2 and a channel 1 are 0° and 180°, respectively. In addition, an amplitude value of the channel 2 is adjusted, so that the following formula is met:

$$\text{maximize}\left(\frac{\text{output}(@0°\text{delta}\cdot\text{phase})}{\text{output}(@180°\text{delta}\cdot\text{phase})}\right)$$

Herein, maximize represents a maximum value, output represents an output, delta represents a difference, and phase represents a phase. The formula is interpreted as follows: @ indicates when . . . ; a numerator in the formula represents an output signal when a phase difference of the two channels is 0°; and a denominator represents an output signal when a phase difference of the two channels is 180°. The amplitude value is adjusted in a calibration process, and a ratio of the two signals is recorded after comparison. When the signal ratio reaches a maximum value (maximize), it is considered that amplitude calibration is completed.

In this way, the amplitude calibration of the two channels can be completed. Amplitude phase calibration of plurality of channels can be implemented in this way step by step.

For amplitude phase calibration of the receive channel, refer to the foregoing amplitude phase calibration of the transmit channel.

After the foregoing amplitude phase calibration is completed, an HBF DPD calibration operation is performed, to obtain better correction performance.

The foregoing correction apparatus may be constructed by using electrical components. In some embodiments of this application, the foregoing correction apparatus may alternatively be constructed in a form of a chip. For example, the correction apparatus in this embodiment of this application is constricted in a form of a multi-channel chip.

Figure 11:
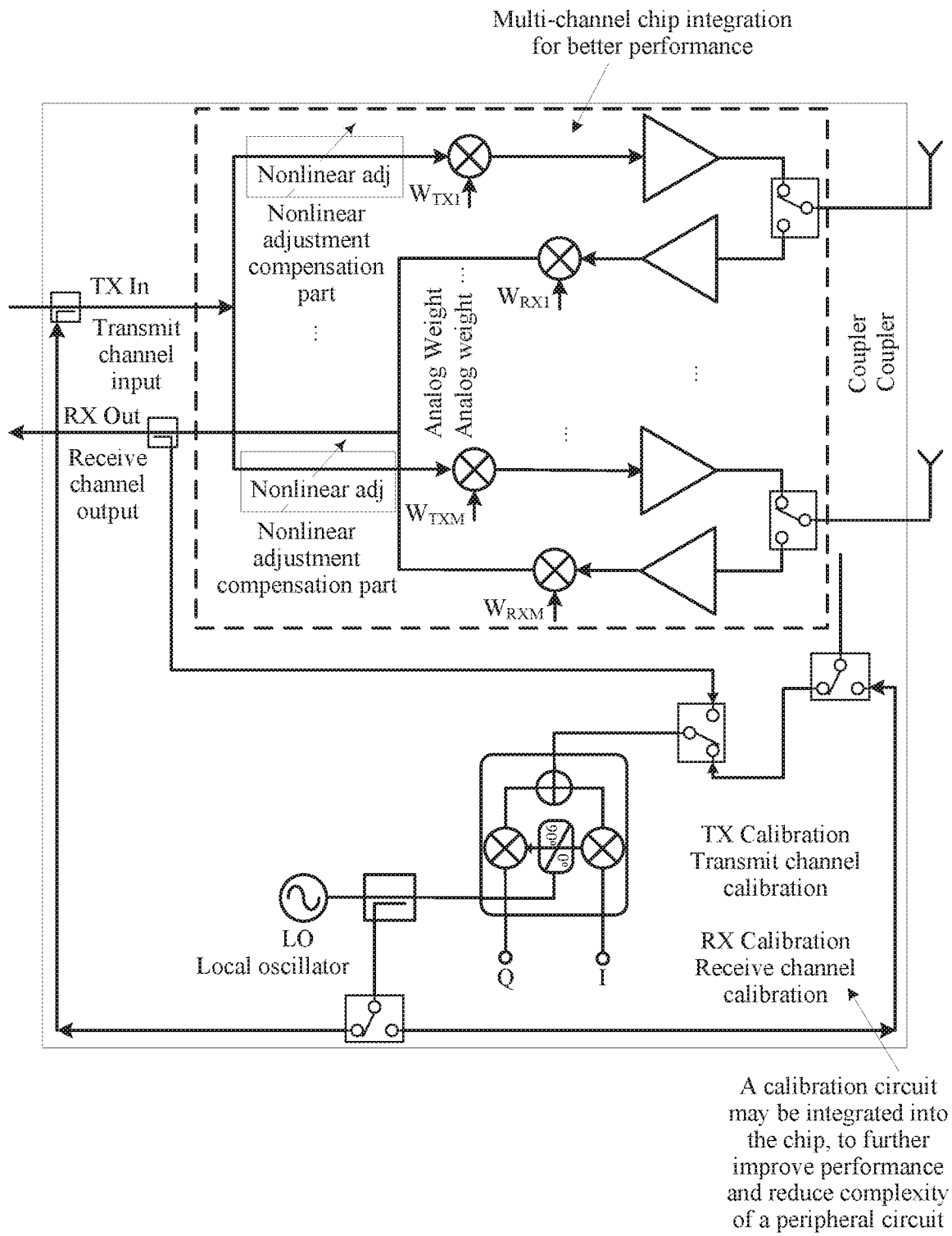
FIG. 11 is a schematic structural diagram of a correction apparatus according to another embodiment of this application.

For example, the correction apparatus shown in FIG. 7A and FIG. 7B is implemented in a separated manner. If a multi-channel chip is used, nonlinear adjustment modules, analog gain adjustment modules, analog phase adjustment modules, power amplifiers, and the like on the plurality of analog channels may be packaged into the chip. In other words, the transmit channel and the receive channel are packaged in a form of a chip. In this embodiment of this application, parts such as a coupler and the switch module may be further packaged into the chip. In other words, the correction channel is packaged into the chip. An example is shown in FIG. 11.

The transmit channel and the receive channel of the correction apparatus in this embodiment of this application are packaged into the chip. The transmit channel is used to transmit a signal, and the receive channel is used to receive a signal. The plurality of analog channels of the correction apparatus shown in FIG. 7A and FIG. 7B are a part of the transmit channel.

Figure 9:
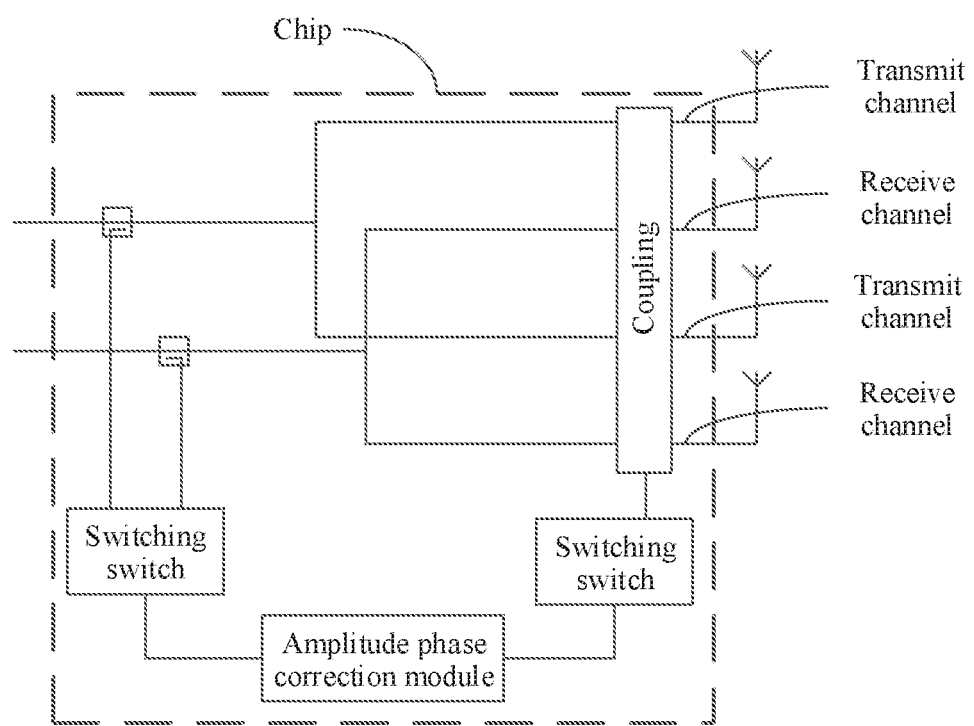
FIG. 9 is a schematic structural diagram of a correction apparatus according to another embodiment of this application.

In some embodiments of this application, the transmit channel and the receive channel are packaged in a form of a chip, the chip includes the transmit channel and the receive channel, and the amplitude phase correction module is separately connected to the transmit channel and the receive channel by using a switching switch. The switching switch is configured to connect the amplitude phase correction module to the transmit channel and the receive channel in a time-division manner, so that the amplitude phase correction module performs amplitude phase calibration on the plurality of transmit channels and performs amplitude phase calibration on the plurality of receive channels in a time-division manner. An example is shown in FIG. 9, while FIG. 11 is a specific example. In this way, a same part used during amplitude phase calibration performed on the transmit channel and used during amplitude phase calibration performed on the receive channel may be shared, thereby reducing setting of the same part and reducing device costs.

Figure 10:
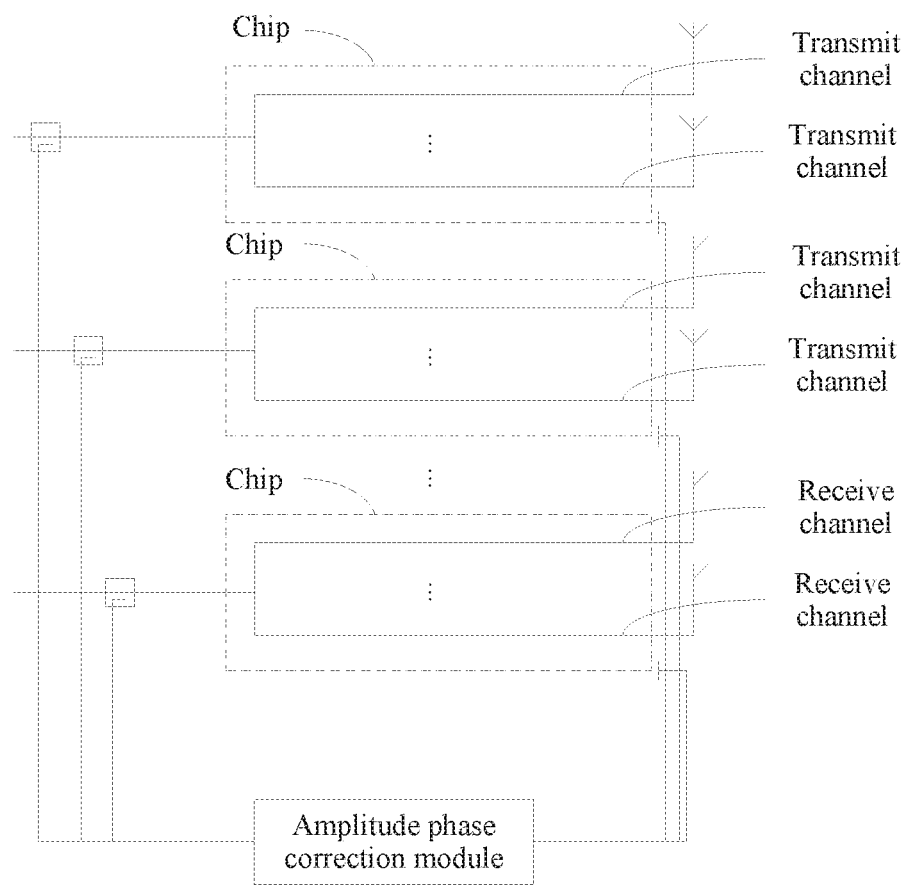
FIG. 10 is a schematic structural diagram of a correction apparatus according to another embodiment of this application.

In some embodiments of this application, the transmit channel and the receive channel are packaged in a form of a chip, there are a plurality of chips, and each chip includes a plurality of transmit channels or a plurality of receive channels. In other words, the chip is a multi-channel chip, as shown in FIG. 10. FIG. 11 is a specific example. The amplitude phase correction module is configured to: first perform amplitude phase calibration on the plurality of transmit channels or the plurality of receive channels in the chip, and then perform amplitude phase calibration on the transmit channels or the receive channels in different chips. In this way, efficiency of amplitude phase calibration can be improved.

In FIG. 11, Nonlinear adj represents a nonlinear adjustment compensation part, Analog weight represents an analog weight of a phased array, a specific value specified for the analog weight is expressed as WTX1, WRX1, or the like, Coupler represents a coupler, and LO represents a local oscillator.

In other words, in some embodiments of this application, a multi-channel chip is used in the correction apparatus, and a plurality of transmit channels and a plurality of receive channels may be packaged into a plurality of chips. In addition, an amplitude phase correction module is connected to the plurality of chips. In a specific process of amplitude phase calibration, amplitude phase calibration may be performed on the transmit channel and the receive channel in the chip, and then amplitude phase calibration is performed on two channels in chips. To be specific, calibration in the chip is first completed by using an integrated circuit in the chip, then calibration in different chips is completed by using the amplitude phase calibration module, and finally calibration of all the transmit channels and receive channels is implemented. Such a manner simplifies an entire calibration process, and can improve amplitude phase calibration efficiency of the transmit channel and the receive channel in this embodiment of this application. In addition, a chip/circuit design combined with a self-calibration technology ensures that amplitudes of signals output by PAs on a plurality of channels are similar.

For example, one DAC is connected to subsequent M chips, and each chip has N channels. In other words, one DAC is connected to subsequent M×N transmit channels. In this case, calibration may be performed in the following manner, where M and N are positive integers.

1. Amplitude phase calibration of internal channels of the M chips may be first started at the same time or at different times. In consideration of efficiency, the M chips may be calibrated at the same time. In this way, it takes N−1 moments in total to complete intra-chip calibration.

2. Amplitude phase calibration of channels in the M chips is then performed. In each chip, only one channel needs to be selected and compared with one channel in another chip.

In this way, the amplitude phase calibration of the analog channels of the correction apparatus takes N−1+M−1 moments in total. If a conventional manner is used, N×(M−1) moments are required for calibration. When values of N and M are large, calibration efficiency is significantly improved.

For amplitude phase calibration between receive channels, refer to the foregoing description. After the amplitude phase calibration is completed, HBF DPD calibration is then performed, to obtain better linearization performance.

Packaging a channel such as the analog channel of the correction apparatus into a chip can improve consistency of the power amplifiers, to obtain better calibration performance. In addition, the power amplifier can be linearized with better performance through inter-device calibration.

Specifically:

(1) After the plurality of channels in this embodiment of this application are packaged into a chip, a die-sharing feature of the multi-channel chip may be used, and a similarity between the plurality of power amplifiers is obtained in physical implementation.

(2) Consistency comparison of amplitudes and phases of the transmit channel and the receive channel in the chip can be completed by a simple coupling and switch design.

For the second point, for an amplitude phase calibration process of the transmit channel and the receive channel, refer to the foregoing description. However, it should be noted that, depending on chip implementation precision, the step "The first two transmit channels are enabled, and then corresponding phase weights are adjusted to maximize and minimize down-converted signals. It may be considered that in this case, phase differences of a channel 2 and a channel 1 are 0° and 180°, respectively" may alternatively be simplified as only minimizing the signal and then recording the value as 180°, and a reverse configuration value of the analog phase adjustment module is 0° by default.

In this way, with reference to a design of a circuit and a chip calibration circuit, a problem of feature/output power consistency for a plurality of PAs is resolved, to ensure calibration performance of an HBF architecture. Through a simple switch and coupling circuit design and sum/difference signal comparison, chip design complexity is reduced, and TX and RX amplitude and phase calibration for a plurality of channels of the circuit are completed, thereby ensuring a beam direction and milling performance. In addition, with reference to a compensation model for a plurality of analog channels, ideal correction performance can be obtained.

In addition, by using an architecture of combining the foregoing single drive channel and the plurality of non-ideal channels, a chip-based design, and the like, costs and power consumption of a device can be significantly reduced, and a result equivalent to that of a conventional single-channel PD can be obtained.

All or some of the foregoing embodiments may be implemented by using software, hardware, firmware, or any combination thereof. When software is used to implement the embodiments, the embodiments may be implemented completely or partially in a form of a computer program product.

The computer program product includes one or more computer instructions. When the computer program instructions are loaded and executed on the computer, the procedure or functions according to the embodiments of the present invention are all or partially generated. The computer may be a general-purpose computer, a dedicated computer, a computer network, or another programmable apparatus. The computer instructions may be stored in a computer-readable storage medium or may be transmitted from one computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device integrating one or more usable media, such as a server or a data center. The usable medium may be a magnetic medium (for example, a floppy disk, a hard disk, or a magnetic tape), an optical medium (for example, a DVD), a semiconductor medium (for example, a solid-state disk (SSD)), or the like.

What is claimed is:

1. A correction apparatus, wherein the correction apparatus comprises a first adjustment module, a plurality of second adjustment modules, a correction calculation module, and a plurality of non-ideal channels, wherein one second adjustment module is disposed on a non-ideal channel of the plurality of non-ideal channels, wherein the first adjustment module is connected to each non-ideal channel, wherein the correction calculation module is separately connected to the first adjustment module and the plurality of second adjustment modules, wherein the correction calculation module is connected to an output end of the each non-ideal channel, and wherein the non-ideal channel is a channel that outputs an output signal in response to a drive signal having an error value;

wherein the correction calculation module is configured to obtain a first adjustment parameter and a second adjustment parameter through calculation based on the output signal of the non-ideal channel and a reference signal, and wherein the reference signal is obtained based on the drive signal;

wherein the first adjustment module is configured to adjust the drive signal based on the first adjustment parameter to uniformly correct error values of output signals of the plurality of non-ideal channels; and wherein the second adjustment module on the each non-ideal channel is configured to adjust a channel signal based on the second adjustment parameter to correct a part that is of the error value and that is not corrected by the first adjustment module, and wherein the channel signal is a signal that is input to the non-ideal channel after the first adjustment module adjusts the drive signal.

2. The correction apparatus according to claim 1, wherein:

the reference signal comprises the drive signal and the input signal of the non-ideal channel;

the correction calculation module comprises a first calculation unit and a second calculation unit, the first calculation unit is connected to the first adjustment module, the second calculation unit is connected to the second adjustment module, and the second calculation unit is further connected to an input end of the non-ideal channel;

the first calculation unit is configured to obtain the first adjustment parameter through calculation based on the output signal of the non-ideal channel and the drive signal; and the second calculation unit is configured to obtain the second adjustment parameter through calculation based on an output signal and an input signal that belong to a same non-ideal channel.

3. The correction apparatus according to claim 1, wherein:

the first adjustment module is a digital predistortion module;

the second adjustment module is a nonlinear adjustment module;

the correction calculation module is a hybrid beamforming (HBF) predistortion calculation module;

the first adjustment parameter is a digital predistortion parameter;

the second adjustment parameter is an analog nonlinear correction parameter;

the drive signal is a digital I/Q complex signal;
the non-ideal channel is an analog channel;
the channel signal is a radio frequency signal;
the correction apparatus further comprises a digital-to-analog converter and a plurality of power amplifiers, one power amplifier is disposed on one analog channel, the power amplifier is connected to an output end of the nonlinear adjustment module, an input end of the digital-to-analog converter is connected to the digital predistortion module, an output end of the digital-to-analog converter is separately connected to the plurality of nonlinear adjustment modules, a factor in generation of the error value of the output signal of the analog channel comprises nonlinearity of the power amplifier, and the output signal of the analog channel is an output signal of the power amplifier;
the digital predistortion module is configured to perform predistortion adjustment on the digital I/Q complex signal based on the digital predistortion parameter to uniformly compensate for nonlinearity of the plurality of power amplifiers; and
the nonlinear adjustment module is configured to perform nonlinear adjustment on the radio frequency signal based on the analog nonlinear correction parameter to compensate for a part that is of the nonlinearity of the power amplifier and that is not compensated by the digital predistortion module.

4. The correction apparatus according to claim 3, wherein the HBF predistortion calculation module is further configured to obtain the digital predistortion parameter through calculation based on an output signal of any analog channel and the digital FQ complex signal.

5. The correction apparatus according to claim 3, wherein:
the reference signal comprises the digital I/Q complex signal and the input signal of the analog channel;
the HBF predistortion calculation module comprises a first calculation unit and a second calculation unit, the first calculation unit is connected to the digital predistortion module, the second calculation unit is connected to the nonlinear adjustment module, and the second calculation unit is further connected to an input end of each analog channel;
the first calculation unit is configured to obtain the digital predistortion parameter through calculation based on the output signal of the analog channel and the digital FQ complex signal; and
the second calculation unit is configured to obtain the analog nonlinear correction parameter through calculation based on an output signal and an input signal that belong to a same analog channel.

6. The correction apparatus according to claim 3, wherein:
a switch module is further disposed between the HBF predistortion calculation module and output ends of the plurality of power amplifiers in the correction apparatus; and
the switch module is configured to select an output signal of one of a plurality of analog channels in a time-division manner, wherein the HBF predistortion calculation module obtains the output signal of the analog channel.

7. The correction apparatus according to claim 3, wherein:
on each analog channel, the correction apparatus further comprises at least one of an analog gain adjustment module or an analog phase adjustment module, the at least one of the analog gain adjustment module or the analog phase adjustment module is close to an input end of the power amplifier, the analog gain adjustment module is connected to the HBF predistortion calculation module, and the analog phase adjustment module is connected to the HBF predistortion calculation module;
the analog gain adjustment module is configured to perform gain adjustment on the radio frequency signal based on an analog gain adjustment parameter;
the analog phase adjustment module is configured to perform phase adjustment on the radio frequency signal based on an analog phase adjustment parameter; and
the HBF predistortion calculation module is further configured to obtain the at least one of the analog gain adjustment parameter or the analog phase adjustment parameter through calculation based on the output signal of the analog channel.

8. The correction apparatus according to claim 3, wherein:
the correction apparatus further comprises an amplitude phase correction module, a plurality of transmit channels, and a plurality of receive channels, the transmit channel and the receive channel each are connected to an antenna, the transmit channel is the analog channel, the receive channel is an analog channel used to receive an antenna signal, one end of the amplitude phase correction module is connected to a port of the antenna, the other end of the amplitude phase correction module is connected to a channel on which a signal is output to the plurality of transmit channels, and the other end of the amplitude phase correction module is further connected to a channel on which a signal is obtained from the plurality of receive channels; and
the amplitude phase correction module is configured to:
perform amplitude phase calibration on the plurality of transmit channels; and
perform amplitude phase calibration on the plurality of receive channels.

9. The correction apparatus according to claim 8, wherein:
the transmit channel and the receive channel are packaged in a form of a chip;
the chip comprises the transmit channel and the receive channel, and the amplitude phase correction module is separately connected to the transmit channel and the receive channel by using a switching switch; and
the switching switch is configured to connect the amplitude phase correction module to the transmit channel and the receive channel in a time-division manner, wherein the amplitude phase correction module performs amplitude phase calibration on the plurality of transmit channels and performs amplitude phase calibration on the plurality of receive channels in a time-division manner.

10. The correction apparatus according to claim 8, wherein:
the transmit channel and the receive channel are packaged in a form of a chip;
each chip of a plurality of chips comprises the plurality of transmit channels or the plurality of receive channels; and
the amplitude phase correction module is configured to:
first perform amplitude phase calibration on the plurality of transmit channels or the plurality of receive channels in the chip; and
then perform amplitude phase calibration on the transmit channels or the receive channels in different chips.

11. A correction method, wherein the method is applied to a correction calculation module in a correction apparatus, wherein the correction apparatus comprises a first adjustment module, a plurality of second adjustment modules, the correction calculation module, and a plurality of non-ideal channels, wherein one second adjustment module is disposed on a non-ideal channel of the plurality of non-ideal channels, wherein the first adjustment module is connected to each non-ideal channel, wherein the correction calculation module is separately connected to the first adjustment module and the plurality of second adjustment modules, wherein the correction calculation module is connected to an output end of the each non-ideal channel, wherein the non-ideal channel is a channel that outputs an output signal in response to a drive signal having an error value, and wherein the method comprises:

obtaining, by the correction calculation module, the output signal of the non-ideal channel and a reference signal, wherein the reference signal is obtained based on the drive signal;

obtaining, by the correction calculation module, a first adjustment parameter and a second adjustment parameter through calculation based on the output signal of the non-ideal channel and the reference signal;

outputting, by the correction calculation module, the first adjustment parameter to the first adjustment module, wherein the first adjustment module adjusts the drive signal based on the first adjustment parameter to uniformly correct error values of output signals of the plurality of non-ideal channels; and outputting, by the correction calculation module, the second adjustment parameter to the second adjustment module on the each non-ideal channel, wherein the second adjustment module on the each non-ideal channel adjusts a channel signal based on the second adjustment parameter to correct a part that is of the error value and that is not corrected by the first adjustment module, wherein the channel signal is a signal that is input to the non-ideal channel after the first adjustment module adjusts the drive signal.

12. The method according to claim 11, wherein:
the reference signal comprises the drive signal and the input signal of the non-ideal channel;
the correction calculation module comprises a first calculation unit and a second calculation unit, the first calculation unit is connected to the first adjustment module, the second calculation unit is connected to the second adjustment module, and the second calculation unit is further connected to an input end of the non-ideal channel; and
the obtaining, by the correction calculation module, a first adjustment parameter and a second adjustment parameter through calculation based on the output signal of the non-ideal channel and the reference signal comprises:

obtaining, by the first calculation unit, the first adjustment parameter through calculation based on the output signal of the non-ideal channel and the drive signal; and obtaining, by the second calculation unit, the second adjustment parameter through calculation based on an output signal and an input signal that belong to a same non-ideal channel.

13. The method according to claim 11, wherein:
the first adjustment module is a digital predistortion module;
the second adjustment module is a nonlinear adjustment module;
the correction calculation module is a hybrid beamforming (HBF) predistortion calculation module;
the first adjustment parameter is a digital predistortion parameter;
the second adjustment parameter is an analog nonlinear correction parameter;
the drive signal is a digital I/Q complex signal;
the non-ideal channel is an analog channel;
the channel signal is a radio frequency signal;
the correction apparatus further comprises a digital-to-analog converter and a plurality of power amplifiers, one power amplifier is disposed on one analog channel, the power amplifier is connected to an output end of the nonlinear adjustment module, an input end of the digital-to-analog converter is connected to the digital predistortion module, an output end of the digital-to-analog converter is separately connected to the plurality of nonlinear adjustment modules, a factor in generation of the error value of the output signal of the analog channel comprises nonlinearity of the power amplifier, and the output signal of the analog channel is an output signal of the power amplifier;
the outputting, by the correction calculation module, the first adjustment parameter to the first adjustment module comprises:

outputting, by the HBF predistortion calculation module, the digital predistortion parameter to the digital predistortion module, wherein the digital predistortion module performs predistortion adjustment on the digital I/Q complex signal based on the digital predistortion parameter, to uniformly compensate for nonlinearity of the plurality of power amplifiers; and the outputting, by the correction calculation module, the second adjustment parameter to the second adjustment module on the each non-ideal channel comprises:

outputting, by the HBF predistortion calculation module, the analog nonlinear correction parameter to the nonlinear adjustment module on each analog channel, wherein the nonlinear adjustment module performs nonlinear adjustment on the radio frequency signal based on the analog nonlinear correction parameter, to compensate for a part that is of the nonlinearity of the power amplifier and that is not compensated by the digital predistortion module.

14. The method according to claim 13, wherein:
the obtaining, by the correction calculation module, an output signal of the non-ideal channel comprises:

obtaining, by the HBF predistortion calculation module, an output signal of any analog channel; and the obtaining, by the correction calculation module, a first adjustment parameter through calculation based on the output signal of the non-ideal channel and the reference signal comprises:

obtaining, by the HBF predistortion calculation module, the digital predistortion parameter through calculation based on the output signal of any analog channel and the digital I/Q complex signal.

15. The method according to claim 13, wherein:
the reference signal comprises the digital I/Q complex signal and the input signal of the analog channel;
the HBF predistortion calculation module comprises a first calculation unit and a second calculation unit, the first calculation unit is connected to the digital predistortion module, the second calculation unit is connected to the nonlinear adjustment module, and the second calculation unit is further connected to an input end of each analog channel;

the obtaining, by the correction calculation module, the output signal of the non-ideal channel and a reference signal comprises:
  obtaining, by the first calculation unit, the output signal of the analog channel and the digital I/Q complex signal; and
  obtaining, by the second calculation unit, the output signal of the analog channel and the input signal of the analog channel; and
the obtaining, by the correction calculation module, a first adjustment parameter and a second adjustment parameter through calculation based on the output signal of the non-ideal channel and the reference signal comprises:
  obtaining, by the first calculation unit, the digital predistortion parameter through calculation based on the output signal of the analog channel and the digital I/Q complex signal; and
  obtaining, by the second calculation unit, the analog nonlinear correction parameter through calculation based on an output signal and an input signal that belong to a same analog channel.

16. The method according to claim 15, wherein the obtaining, by the second calculation unit, the analog nonlinear correction parameter through calculation based on an output signal and an input signal that belong to a same analog channel comprises:
  obtaining, by the second calculation unit, a difference value through calculation based on the output signal and the input signal that belong to the same non-ideal channel, wherein the difference value is a difference between an output signal of the power amplifier on the analog channel and a preset output signal; and
  obtaining, by the second calculation unit, the analog nonlinear correction parameter through calculation by applying a cascaded predistortion (PD) model to the difference value.

17. The method according to claim 13, wherein:
on each analog channel, the correction apparatus further comprises at least one of an analog gain adjustment module or an analog phase adjustment module, the at least one of the analog gain adjustment module or the analog phase adjustment module is close to an input end of the power amplifier, the analog gain adjustment module is connected to the HBF predistortion calculation module, and the analog phase adjustment module is connected to the HBF predistortion calculation module; and
the method further comprises:
  obtaining, by the HBF predistortion calculation module, the at least one of an analog gain adjustment parameter or an analog phase adjustment parameter through calculation based on the output signal of the analog channel;
  outputting, by the HBF predistortion calculation module, the analog gain adjustment parameter to the analog gain adjustment module, wherein the analog gain adjustment module performs gain adjustment on the radio frequency signal based on the analog gain adjustment parameter; and
  outputting, by the HBF predistortion calculation module, the analog phase adjustment parameter to the analog phase adjustment module, wherein the analog phase adjustment module performs phase adjustment on the radio frequency signal based on the analog phase adjustment parameter.

* * * * *